(12) United States Patent
Zhang et al.

(10) Patent No.: US 12,163,914 B2
(45) Date of Patent: Dec. 10, 2024

(54) DETECTION DEVICE AND DETECTION METHOD

(71) Applicant: Shanghai Tianma Micro-Electronics Co., Ltd., Shanghai (CN)

(72) Inventors: Kaidi Zhang, Shanghai (CN); Baiquan Lin, Shanghai (CN); Huihui Jiang, Shanghai (CN); Luning Yang, Shanghai (CN); Wei Li, Shanghai (CN); Yunfei Bai, Shanghai (CN); Zhenyu Jia, Shanghai (CN); Kerui Xi, Shanghai (CN); Feng Qin, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 461 days.

(21) Appl. No.: 17/682,979

(22) Filed: Feb. 28, 2022

(65) Prior Publication Data

US 2023/0213474 A1    Jul. 6, 2023

(30) Foreign Application Priority Data

Dec. 31, 2021  (CN) .......................... 202111659394.8

(51) Int. Cl.
  *G01N 27/414*   (2006.01)
  *G01N 27/333*   (2006.01)
  *H01L 21/768*   (2006.01)

(52) U.S. Cl.
  CPC ......... *G01N 27/414* (2013.01); *G01N 27/333* (2013.01); *H01L 21/76829* (2013.01)

(58) Field of Classification Search
  USPC .......................................................... 257/253
  See application file for complete search history.

(56) References Cited

U.S. PATENT DOCUMENTS

| | | | | |
|---|---|---|---|---|
| 10,429,237 | B2 * | 10/2019 | Ma | .......................... G01J 1/44 |
| 2020/0213536 | A1 * | 7/2020 | Wang | ..................... H04N 25/76 |
| 2021/0141101 | A1 * | 5/2021 | Chung | .............. H01L 27/14643 |
| 2022/0173142 | A1 * | 6/2022 | Shi | .................... H01L 27/14689 |

FOREIGN PATENT DOCUMENTS

CN             102243126 B       1/2013

* cited by examiner

Primary Examiner — Nicholas J Tobergte
(74) Attorney, Agent, or Firm — Anova Law Group, PLLC

(57) ABSTRACT

A detection device and a detection method are provided. The detection device includes at least one detection unit. The detection unit includes a first transistor, a second transistor, a third transistor and a fourth transistor that are electrically connected to each other, a gate is disposed above a channel of each of the first transistor, the second transistor, and the third transistor, and an ion-sensitive membrane is covered above a channel of the fourth transistor. The detection device also includes a first voltage signal terminal, a second voltage signal terminal, and a third voltage signal terminal. Further, the detection device includes a first power supply terminal, a first potential output terminal, a second potential output terminal, and a second power supply terminal.

20 Claims, 12 Drawing Sheets

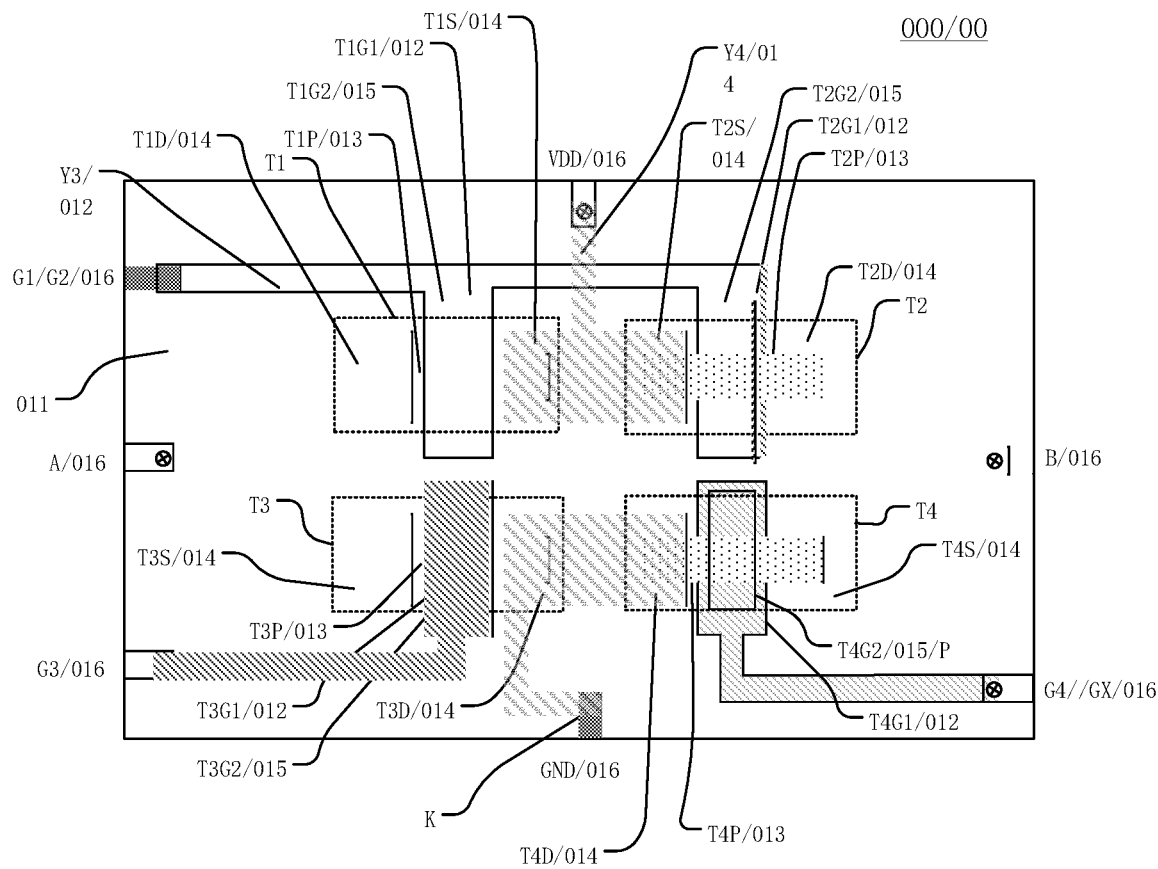

FIG. 18

Placing the detection device in the to-be-detected solution, and adjusting the potential of the third voltage signal terminal such that the potential difference between the first potential output terminal and the second potential output terminal is 0 — S10

Calculating the concentration of the to-be-detected solution according to the adjusted potential of the third voltage signal terminal when the potential difference between the first potential output terminal and the second potential output terminal is 0 — S11

FIG. 19

DETECTION DEVICE AND DETECTION METHOD

CROSS-REFERENCE TO RELATED APPLICATION

This application claims the priority of Chinese Patent Application No. 202111659394.8, filed on Dec. 31, 2021, the content of which is incorporated by reference in its entirety.

TECHNICAL FIELD

The present disclosure generally relates to the field of detection technologies and, more particularly, relates to a detection device and a detection method.

BACKGROUND

Ion sensitive field-effect transistors (ISFETs) are a kind of microelectronic ion selective sensitive elements, which have the dual characteristics of electrochemistry and transistor. ISFETs have been applied in clinical, food, environment, military and even robotics due to their advantages of small sensitive area, fast response, high sensitivity, low output impedance, low sample consumption, easy mass manufacturing and low cost, and will play an increasingly important role in many fields, especially in the field of biochemical sensing.

The existing ISFETs use a surface treatment technology to make the sensitive film adsorb specific ions or molecules. These charged ions or molecules will change the conductivity of the channel of the ISFET. By monitoring the change of the conductivity of the channel of the ISFET through an external circuit, the concentration of ions or molecules in a tested solution is indirectly obtained. Taking the substrate structure of a double-gated ion-sensitive field-effect transistor used for the pH detection as an example, when the ISFET has an ion-sensitive layer on the surface and the device is immersed in the to-be-tested solution, the charges of the surface of the ion-sensitive layer will change according to the concentration/change of hydrogen ions (H+), which affects the threshold voltage of the ISFET. Its pH value can be determined by detecting the threshold voltage change or the output signal change, and by setting different ion-sensitive membranes on the surface, the concentrations of other ions corresponding to the surface liquid can also be obtained through similar principles. ISFETs can be used to detect pH, metal ions, blood sugar, genes and proteins.

However, ISFETs have problems of poor stability and easy to be affected by the environment. For example, due to environmental factors (light, or temperature, etc.) and fluctuations in their own characteristics, the relative threshold voltage is easy to change, and the output signal itself will have large fluctuations, and it is difficult to calibrate, resulting in a large detection error.

Therefore, there is a need to develop a detection device and a detection method which can realize a self-calibration and is with improved detection accuracy and stability. The present disclosed detection devices and detection methods are direct to solve one or more problems set forth above and other problems in the arts.

SUMMARY

One aspect of the present disclosure provides a detection device. The detection device includes at least one detection unit. The at least one detection unit includes a first transistor, a second transistor, a third transistor and a fourth transistor that are electrically connected to each other, a gate is disposed above a channel of each the first transistor, the second transistor, and the third transistor, and an ion-sensitive membrane covers above a channel of the fourth transistor. The detection device also includes a first voltage signal terminal, a second voltage signal terminal, and a third voltage signal terminal. The first voltage signal terminal is electrically connected to the gate of the first transistor, the second voltage signal terminal is electrically connected to the gate of the second voltage signal terminal, and the third voltage signal terminal is electrically connected to the gate of the third transistor. A source of the first transistor and a source of the second transistor are electrically connected to a first power supply terminal, a drain of the first transistor and a source of the third transistor are electrically connected to a first potential output terminal, a drain of the second transistor and a source of the fourth transistor are electrically connected to a second potential output terminal, and a drain of the third transistor and a drain of the fourth transistor are electrically connected to a second power supply terminal.

Another aspect of the present disclosure provides a detection method. The detection method includes providing a detection device. The detection device includes at least one detection unit. The at least one detection unit includes a first transistor, a second transistor, a third transistor and a fourth transistor that are electrically connected to each other, a gate is disposed above a channel of each the first transistor, the second transistor, and the third transistor, and an ion-sensitive membrane covers above a channel of the fourth transistor. The detection device also includes a first voltage signal terminal, a second voltage signal terminal, and a third voltage signal terminal. The first voltage signal terminal is electrically connected to the gate of the first transistor, the second voltage signal terminal is electrically connected to the gate of the second voltage signal terminal, and the third voltage signal terminal is electrically connected to the gate of the third transistor. A source of the first transistor and a source of the second transistor are electrically connected to a first power supply terminal, a drain of the first transistor and a source of the third transistor are electrically connected to a first potential output terminal, a drain of the second transistor and a source of the fourth transistor are electrically connected to a second potential output terminal, and a drain of the third transistor and a drain of the fourth transistor are electrically connected to a second power supply terminal. The detection method also includes placing the detection device in a to-be-detected solution; adjusting a potential of the third voltage signal terminal to cause a potential difference between the first potential output terminal and the second potential output terminal to be zero; and when the potential difference between the first potential output terminal and the second potential output terminal is zero, obtaining a concentration of the to-be-detected solution by calculation according to an adjusted potential of the third voltage signal terminal.

Another aspect of the present disclosure includes providing a detection method. The detection method includes providing a detection device. The detection device includes at least one detection unit. The at least one detection unit includes a first transistor, a second transistor, a third transistor and a fourth transistor that are electrically connected to each other, a gate is disposed above a channel each of the first transistor, the second transistor, and the third transistor, and an ion-sensitive membrane covers above a channel of the fourth transistor. The detection device also includes a first voltage signal terminal, a second voltage signal terminal, and a third voltage signal terminal. The first voltage signal terminal is electrically connected to the gate of the first transistor, the second voltage signal terminal is electrically connected to the gate of the second voltage signal terminal, and the third voltage signal terminal is electrically connected to the gate of the third transistor. A source of the first transistor and a source of the second transistor are electrically connected to a first power supply terminal, a drain of the first transistor and a source of the third transistor are electrically connected to a first potential output terminal, a drain of the second transistor and a source of the fourth transistor are electrically connected to a second potential output terminal, and a drain of the third transistor and a drain of the fourth transistor are electrically connected to a second power supply terminal. The first transistor, the second transistor, the third transistor and the fourth transistor are all dual-gate transistors; a bottom gate of the first transistor is electrically connected to the first voltage signal terminal; a bottom gate of the second transistor is electrically connected to the second voltage signal terminal; a bottom gate of the third transistor is electrically connected to the third voltage the signal terminal; a bottom gate of the fourth transistor is electrically connected to a fourth voltage signal terminal; and a top gate of the first transistor, a top gate of the second transistor and a top gate of the third transistor are all electrically connected to the second power supply terminal; the first voltage signal terminal and the second voltage signal terminal are electrically connected to a same first constant potential; the third voltage signal terminal is electrically connected to a second constant potential; the fourth voltage signal terminal is an adjustable potential terminal; and the top gate of the fourth transistor is a to-be-detected potential terminal. The detection method also includes placing the detection device in a to-be-detected solution; adjusting a potential of the fourth voltage signal terminal to cause a potential difference between the first potential output terminal and the second potential output terminal to be zero; when the potential difference between the first potential output terminal and the second potential output terminal is zero, calculating a potential difference between the third voltage signal terminal and the fourth voltage signal terminal; calculating a voltage variation of the to-be-detected potential terminal according to the potential difference between the third voltage signal terminal and the fourth voltage signal terminal; and obtaining a concentration of the to-be-detected solution by calculation according to the voltage variation of the to-be-detected potential terminal.

Other aspects of the present disclosure can be understood by those skilled in the art in light of the description, the claims, and the drawings of the present disclosure.

BRIEF DESCRIPTION OF THE DRAWINGS

The drawings incorporated in the specification and constituting a part of the specification illustrate the embodiments of the present disclosure, and together with the description are used to explain the principle of the present disclosure.

FIG. 18 illustrates a top view of the exemplary detection device in FIG. 14;

FIG. 19 illustrates a flowchart of an exemplary detection method of the present disclosed detection device according to various disclosed embodiments of the present disclosure.

DETAILED DESCRIPTION

Various exemplary embodiments of the present disclosure will now be described in detail with reference to the accompanying drawings. It should be noted that the relative arrangement of components and steps, the numerical expressions and numerical values set forth in these embodiments do not limit the scope of the disclosure unless specifically stated otherwise.

The following description of at least one exemplary embodiment is merely illustrative in nature and is in no way intended to limit the disclosure, its application, or uses.

Techniques, methods, and apparatus known to those of ordinary skill in the relevant art may not be discussed in detail, but where appropriate, such techniques, methods, and apparatus should be considered part of the specification.

In all examples shown and discussed herein, any specific values should be construed as illustrative only and not limiting. Accordingly, other instances of the exemplary embodiment may have different values.

It should be noted that similar numerals and letters refer to the similar items in the following figures, so once an item is defined in one figure, it does not require further discussion in subsequent figures.

Figure 1:
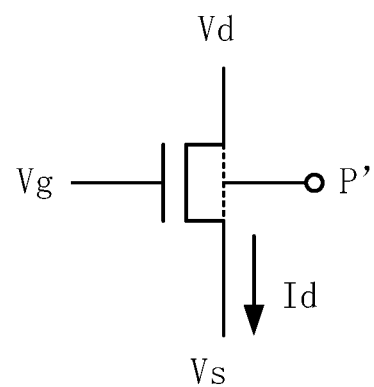
FIG. 1 illustrates a circuit structure of a device used for detecting pH value.

FIG. 1 is a schematic diagram of the circuit structure of a device used for detecting a pH value. The working principle of the circuit of the dual-gate ion-sensitive field-effect transistor for pH detection in FIG. 1 can be explained as following.

Figure 2:
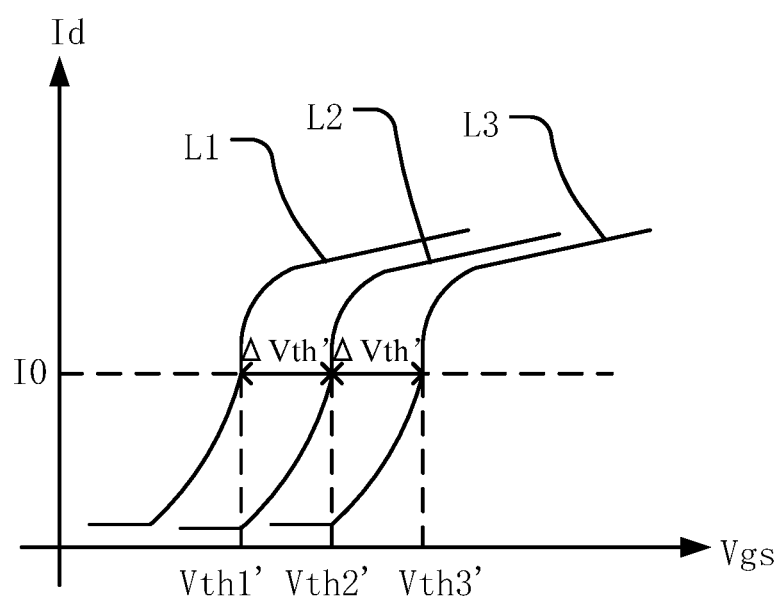
FIG. 2 illustrates an Ids–Vgs characteristic curve of the detection device in FIG. 1.

As shown in FIG. 1, the point P' is the to-be-detected potential point, and its potential is affected by the reference electrode (usually grounded) and the ion concentration of the to-be-tested solution. At the same time, the potential of the point P' is used as the top gate of the ISFET device 00' to modulate the threshold voltage Vth'. During a detection process, it is equivalent to scanning the voltage Vgs of the device 00', and the output current of the device 00' can be detected to obtain its characteristic curve, as shown in FIG. 2, which is the Ids–Vgs characteristic curve corresponding to the detection device in FIG. 1. As shown in FIG. 2, the curve L1 corresponds to a solution with a pH value of 5, the curve L2 corresponds to a solution with a pH value of 6, and the curve L3 corresponds to a solution with a pH value of 7. When the ion concentration (pH value in FIG. 2) changes, the potential of the point P' changes ΔVp', and the threshold voltage Vth' of the device 00' (Vth1', Vth2', Vth3' in FIG. 2) shifts ΔVth accordingly, and ΔVth'=ΔVp'×Cis/Cbg. Cis is the capacitance of the insulation layer of the top gate of the ISFET device 00', Cbg is the capacitance of the insulation layer of the bottom gate of the ISFET device 00'. When the corresponding characteristic curve changes, the required voltage value corresponding to the same current I0 (shown by the dotted line in FIG. 2) changes ΔVth'. Therefore, the change of the ion concentration can be finally obtained from the change of the potential at the point P'. However, because the characteristics of ISFET are affected by various factors, such as environment and process, the output signal itself has large fluctuations, and it needs to be calibrated before each test, which is not conductive to batch use, and even if it is calibrated before the test, the test results are not reliable enough either.

The present disclosure provides a detection device and a detection method which may realize a self-calibration and facilitate to improve detection accuracy and stability.

Figure 3:
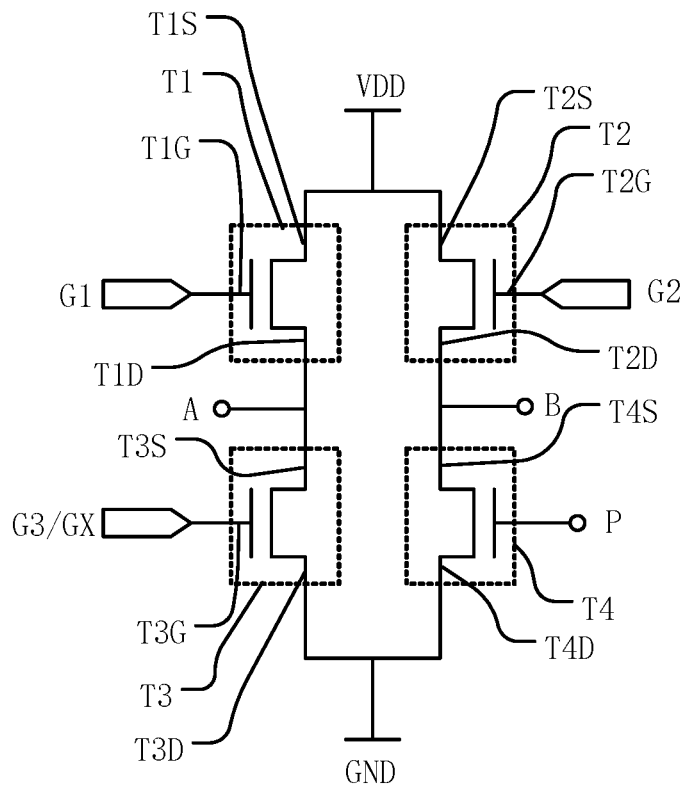
FIG. 3 illustrates a circuit connection structure of an exemplary detection device according to various disclosed embodiments of the present disclosure.
Figure 4:
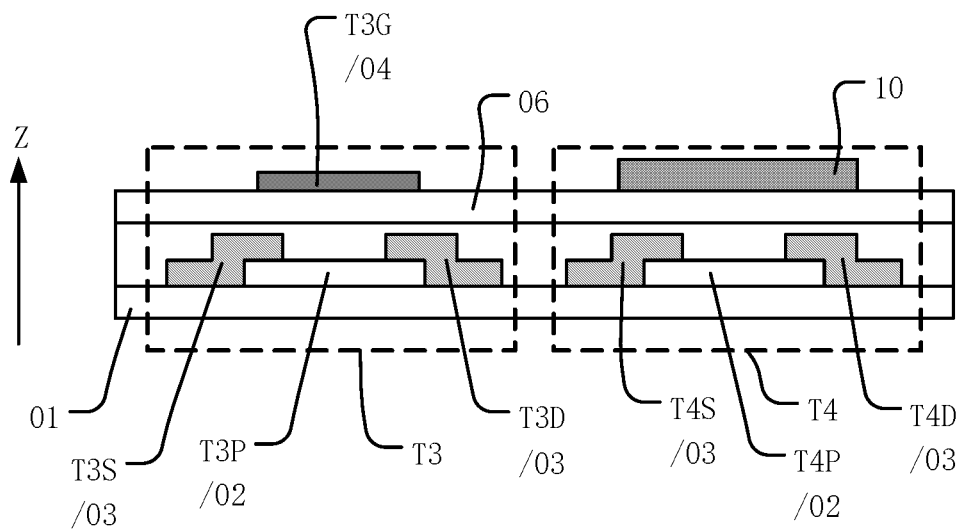
FIG. 4 illustrates a structure of the exemplary device in FIG. 3.

FIG. 3 is a schematic diagram of a circuit connection structure of an exemplary detection device according to various disclosed embodiments of the present disclosure. FIG. 4 is a schematic structural diagram of the exemplary detection device in FIG. 3. As shown in FIGS. 3-4, a detection device 000 provided in the present disclosure may include at least a detection unit 00. The detection unit 00 may include a first transistor T1, a second transistor T2, a third transistor T3 and a fourth transistor T4 electrically connected to each other. Gates may be disposed above the channels of the first transistor T1, the second transistor T2, and the third transistor T3. An ion-sensitive membrane 10 may be disposed above and cover the channel of the fourth transistor T4. It can be understood that the ion-sensitive membrane 10 is not shown in FIG. 3, when the detection unit 00 is formed on a substrate/or a base, it may only be necessary to dispose the ion sensitive membrane 10 above the channel of the fourth transistor T4. It should be noted that FIG. 4 only shows the third transistor T3 and the fourth transistor T4, and the film layer structures of the first transistor T1 and the second transistor T2 may be understood with reference to the structure of the third transistor T3.

The detection unit 00 may also include a first voltage signal terminal G1, a second voltage signal terminal G2, and a third voltage signal terminal G3. The first voltage signal terminal G1 may be electrically connected to the gate T1G of the first transistor T1, the second voltage signal terminal G2 may be electrically connected to the gate T2G of the second transistor T2, and the third voltage signal terminal G3 may be electrically connected to the gate T3G of the third transistor T3.

The source T1S of the first transistor T1 and the source T2S of the second transistor T2 may be electrically connected to a first power supply terminal VDD. The drain T1D of the first transistor T1 and the source T3S of the third transistor T3 may be electrically connected to a first potential output terminal A. The drain T2D of the second transistor T2 and the source T4S of the fourth transistor T4 may be electrically connected to a second potential output terminal B. The drain T3D of the third transistor T3 and the drain T4D of the fourth transistor T4 may be electrically connected to a second power supply terminal GND.

The detection device 000 provided in this embodiment may be used to detect the concentration of ions in a solution, such as hydrogen ions (pH value), or ammonium cations (NH4+), etc. The detection device 000 may include at least one detection unit 00. In one embodiment, as shown in FIG. 3, the detection device 000 may include only one detection unit 00. In some embodiments, the detection device 000 may also include multiple detection units 000 illustrated in FIG. 3.

The detection unit 00 of this embodiment may include the first transistor T1, the second transistor T2, the third transistor T3 and the fourth transistor T4 that may be electrically electrically connected to each other. Gates may be disposed above the channels of the first transistor T1, the second transistor T2, and the third transistor T3. It can be understood that, as shown in FIG. 4, when the third transistor T3 is disposed on the substrate 01, in the direction perpendicular to the plane where in the substrate 01 is located, the overlap region between the gate T3G of the third transistor T3 and the active region T3P of the third transistor T3 may be the channel of the third transistor T3. Similarly, as shown in FIG. 4, in a direction perpendicular to the plane where the substrate 01 is located, the channel of the fourth transistor T4 is as shown in FIG. 4, and the ion-sensitive membrane 10 may be disposed above the channel of the fourth transistor T4. The gates of the first transistor T1, the second transistor T2, and the third transistor T3 may all be disposed above their own channels, and the ion-sensitive membrane 10 may be disposed above the channel of the fourth transistor T4. It can be understood that in this embodiment, at least an insulation layer may be disposed between the active region of each transistor and its own gate (the region between the active region T3P and the gate T3G of the third transistor T3 as shown in FIG. 4), such as the insulation layer 06 in FIG. 4. The insulation layer 06 may be used to prevent the conduction between the active region and the gate of the transistor from affecting the performance of the transistor. In some embodiments, other insulation layers may also be disposed between the active region of each transistor and its own gate, which may provide an insulating effect between conductive film layers at other positions in the detection device. In one embodiment, disposing the gate above the channel of the transistor may mean that the gate of the transistor is located above the channel of the transistor, but may not mean that the gate of the transistor and the active region of the transistor are directly covered and arranged.

The detection unit 00 of this embodiment may further include the first voltage signal terminal G1, the second voltage signal terminal G2, and the third voltage signal terminal G3. The first voltage signal terminal G1 may be electrically connected to the gate T1G of the first transistor T1, and may be configured to provide a constant potential to the gate T1G of the first transistor T1. The second voltage signal terminal G2 may be electrically connected to the gate T2G of the second transistor to provide a constant potential for the gate T2G of the second transistor T2. The third voltage signal terminal G3 may be electrically connected to the gate T3G of the third transistor T3, and the third voltage signal terminal G3 may be configured as an adjustable potential terminal for adjusting the potential of the third voltage signal terminal G3 during the detection process such that, when the detection device 000 is immersed in the to-be-detected solution and when the potential of the ion-sensitive membrane 10 above the channel of the fourth transistor T4 changes, the detection unit 00 may detect the ion concentration in the to-be-tested solution by adjusting the potential of the third voltage signal terminal G3.

The four transistors in this embodiment may be electrically connected to each other to form a structure that can detect the ion concentration in the solution. One specific connection relationship may be as following.

The source T1S of the first transistor T1 and the source T2S of the second transistor T2 may be electrically connected to the first power supply terminal VDD. The first power supply terminal VDD may be configured to provide a first power supply signal for the detection unit 00. The drain T1D of the first transistor T1 and the source T3S of the third transistor T3 may be electrically connected to the first potential output terminal A. The first potential output terminal A may be used as a detection potential terminal. The drain T2D of the second transistor T2 and the source T4S of the fourth transistor T4 may be electrically connected to the second potential output terminal B. The second potential output terminal B may be configured as another detection potential terminal.

In one embodiment, during the detection process, an ammeter may be electrically connected between the first potential output terminal A and the second potential output terminal B to test the potential difference between the first potential output terminal A and the second potential output terminal B. The drain T3D of the third transistor T3 and the drain T4D of the fourth transistor T4 may be electrically connected to the second power supply terminal GND, and the second power supply terminal GND may be configured to provide the detection unit 00 with a second power supply signal. In one embodiment, the voltage of the first power supply terminal VDD may be greater than the voltage of the second power supply terminal GND. The second power supply terminal GND may be electrically connected to a ground signal or a negative potential signal such that a connection path may be formed between the first power supply terminal VDD and the second power supply terminal GND.

During the detection process, the first voltage signal terminal G1 and the second voltage signal terminal G2 may be electrically connected to a constant potential, respectively. In one embodiment, the potential of the first voltage signal terminal G1 and the potential of the second voltage signal terminal G2 may be equal. The device 000 may be placed in the to-be-tested solution. Because the fourth transistor T4 may have the ion-sensitive membrane 10 above the channel, when the ion-sensitive membrane 10 contacts the ions in the to-be-detected solution, for example, the ion-sensitive membrane 10 may be sensitive to hydrogen ions, the potential of the surface of the ion-sensitive membrane 10 may change when it comes into contact with the hydrogen ions in the solution. Accordingly, the potential of the ion-sensitive membrane 10 above the channel of the fourth transistor T4 may change. That is, the portion of the ion-sensitive membrane 10 above the channel of the fourth transistor T4 may be used as the to-be-detected potential terminal. If the voltage value of the to-be-detected potential terminal changes, the potential difference between the first potential output terminal A and the second potential output terminal B may also change; and the voltage of the first potential output terminal A and the voltage of the second potential output terminal B may not be equal. At this time, the potential of the third voltage signal terminal G3 used as the adjustable potential terminal may be adjusted to cause the potential values of the first potential output terminal A and the second potential output terminal B to remain equal, that is, the voltage difference between the first potential output terminal A and the second potential output terminal B may be zero. When the voltage difference between the first potential output terminal A and the second potential output terminal B is zero, the potential at the portion of the ion-sensitive membrane 10 above the channel of the fourth transistor T4 serving as the to-be-detected potential terminal may be the adjusted potential of the third voltage signal terminal G3. Thus, according to the adjusted potential of the third voltage signal terminal G3, the potential of the portion of the ion-sensitive membrane 10 above the channel of the fourth transistor T4 after the detection device is immersed in the to-be-detected solution may be obtained, and the ion concentration of the to-be-detected solution may be obtained by calculation. Because the structures and environments of the first transistor T1 and the second transistor T2 may be same, the voltage values of the gate of the first transistor T1 and the gate of the second transistor T2 may be same, and the voltage values of the source of the first transistor T1 and the source of the second transistor T2 may be same, the output currents of the first transistor T1 and the second transistor T2 may also be same. Further, when the potential values of the first potential output terminal A and the second potential output terminal B are equal, the output currents of the third transistor T3 and the fourth transistor T4 may also be considered as same. Thus, the potential at the portion of the ion-sensitive membrane 10 above the channel of the fourth transistor T4 may be same as the voltage at the third voltage signal terminal G3 electrically connected to the gate of the third transistor T3 at this time.

Because the output current of the transistor may be relatively small, and may be greatly affected by factors such as the detection environment (temperature, illumination, etc.) and process, it may be difficult to obtain the corresponding change in the threshold voltage through a direct detection. Therefore, in this embodiment, four transistors with the same structure may be electrically connect to each other, only one of the four transistors may need to be used as the detection transistor. Because the four transistors may be jointly fabricated on the substrate 01 by the same process, and may be in the same environment during the detection process, the fluctuations of the characteristics of the four transistors themselves may be kept synchronized, and it may only need to obtain a slight change in the potential at the portion of the ion-sensitive membrane 10 above the channel of the fourth transistor T4 serving as the to-be-detected potential terminal. The potential at the portion of the ion-sensitive membrane 10 above the channel of the fourth transistor T4 serving as the detection transistor may be subject to the influence of the to-be-detected solution, and the potential influence may have nothing to do with the influence of other factors of the transistors, and may only be related to the ion concentration of the solution. Further, the first potential output terminal A and the second potential output terminal B may have no external output current, the potentials of the first potential output terminal A and the second potential output terminal B may not be affected by the to-be-detected solution. Thus, the potentials of the first potential output terminal A and the second potential output terminal B may have a high reliability.

For the concentration detection in FIG. 1, where one dual-gate ion-sensitive field-effect transistor is used, the output of the dual-gate ion-sensitive field-effect transistor is easily affected by the process fluctuations and the environment. Therefore, when detecting different solution concentrations, it is necessary to calibrate each device according to the use environment. In the present disclosure, the relationship between the potential of the to-be-detected potential terminal and the ion concentration of the to-be-detected solution may only be related to the type of to-be-detected ions. In the detection process, the potential of the adjustable potential terminal may be adjusted to cause the potential difference between the first potential output terminal A and the second potential output terminal B to be zero, which may realize the self-calibration of the detection device, and the error of the final detection result may be substantially small. Thus, the detection accuracy and stability of the detection device may be improved.

It can be understood that, as shown in FIG. 4, the portion of the fourth transistor T4 above its channel may be covered with the ion-sensitive membrane 10, during the manufacturing process, the ion-sensitive membrane 10 may be formed after the gates of other transistors are fabricated. In some embodiments, the ion-sensitive membrane 10 may also be fabricated after the gates of other transistors are fabricated. It may only need to satisfy that when the detection device 000 is immersed in the solution, the ion-sensitive membrane 10 may directly contact the solution such that it may be subjected to the change of ion concentration to generate a potential change, and then the potential of the third voltage signal terminal G3 electrically connected to the gate T3G of the third transistor T3 may be adjusted to cause the potential difference between the first potential output terminal A and the second potential output terminal B to be zero. For example, the ion-sensitive membrane 10 may be in contact with the gates of other transistors.

In one embodiment, as shown in FIG. 4, the ion-sensitive membrane 10 may be coated only above the channel of the fourth transistor T4 such that, through the ion-sensitive membrane 10, the potential at the portion of the ion-sensitive membrane 10 above the channel of the fourth transistor T4 used as the to-be-detected potential terminal may change due to the contact with the solution. Thus, while the ion concentration in the solution may be detected, the materials may be saved, which may be beneficial to reducing manufacturing costs.

Figure 5:
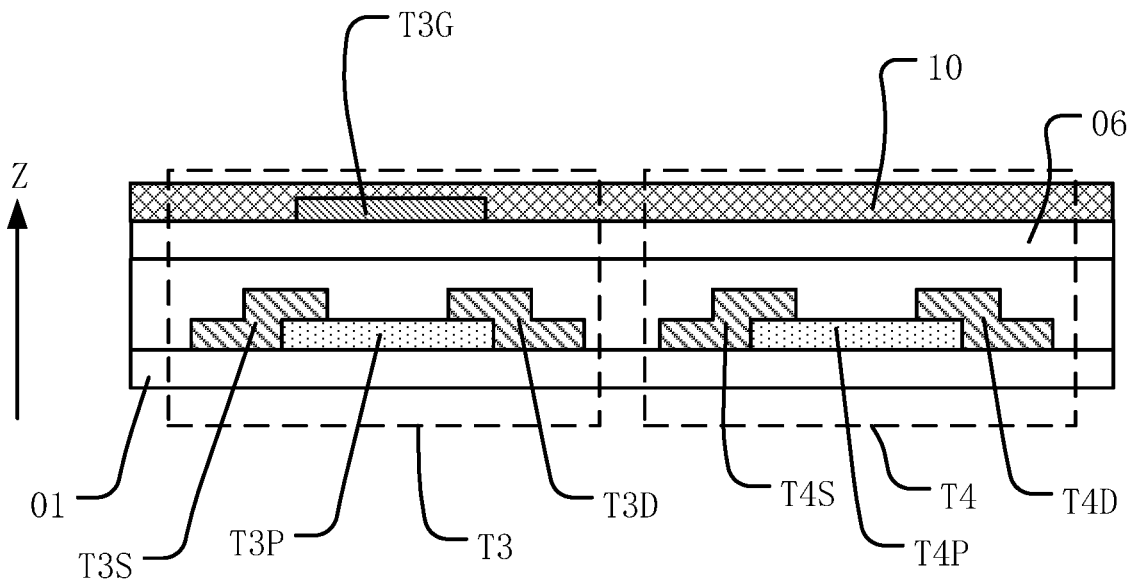
FIG. 5 illustrates another structure of the exemplary device in FIG. 3.

FIG. 5 illustrates another schematic structural diagram of the detection device in FIG. 3. As shown in FIG. 5, the ion-sensitive membrane 10 may be a structure that covers the entire surface above the channel of the fourth transistor T4. For example, the coverage area of the ion-sensitive membrane 10 may be substantially the same as the area of the substrate 01 (same within the error range), which may be beneficial to reduce the difficulty of the process and facilitate the fabrication of the ion-sensitive membrane 10. Because the gate of the first transistor T1 and the gate of the second transistor T2 may be both electrically connected to a constant potential, although the gate of the third transistor T3 is an adjustable potential terminal, it may also has a variable potential value, which may be equivalent to that the gate of the first transistor T1, the gate of the second transistor T2, and the gate of the third transistor T3 may have shielding functions. Thus, even if the ion-sensitive membrane 10 covers the gates of the first transistor T1, the second transistor T2, and the third transistor T3, the influence of ions in the to-be-detected solution on the gate potentials of the three transistors may also be avoided by the shielding effect. At the same time, the environment difference between the fourth transistor and other transistors may be further reduced, which may be beneficial to further improve the detection accuracy.

It should be noted that the above "the coverage area of the ion-sensitive membrane 10 may be substantially the same as the area of the substrate 01" may mean that the ion-sensitive membrane 10 may cover all the first transistors T1, the second transistors T2, the third transistors T3 and the fourth transistors T4 on the detection device. The specific size of the ion-sensitive membrane 10 may be appropriately adjusted according to the shape or size of the detection device, for example, it may be narrower than the substrate 01 of the detection device, or it can be beyond the substrate 01 of the detection device.

It should be further explained that FIG. 3 and FIG. 4 in this embodiment only illustrate the circuit connection relationship structure and the film layer structure of the transistors. During a specific implementation, a plurality of signal lines may be arranged on the substrate 01 of the detection device 000, such as a signal line used to provide a constant potential to the first voltage signal terminal G1 and the second voltage signal terminal G2, a signal line used to provide a power supply signal to the first power supply terminal VDD and the second power supply terminal GND, a signal detection line for detecting the potential of the first potential output terminal A and the second potential output terminal B, etc., and the adjustment signal line used to adjust the potential of the third voltage signal terminal G3, etc. The specific setting position may be set according to actual needs, this embodiment does not limit it, it may only need to satisfy that the structures of the above-mentioned signal lines on the substrate 01 do not affect the detection effect.

Figure 6:
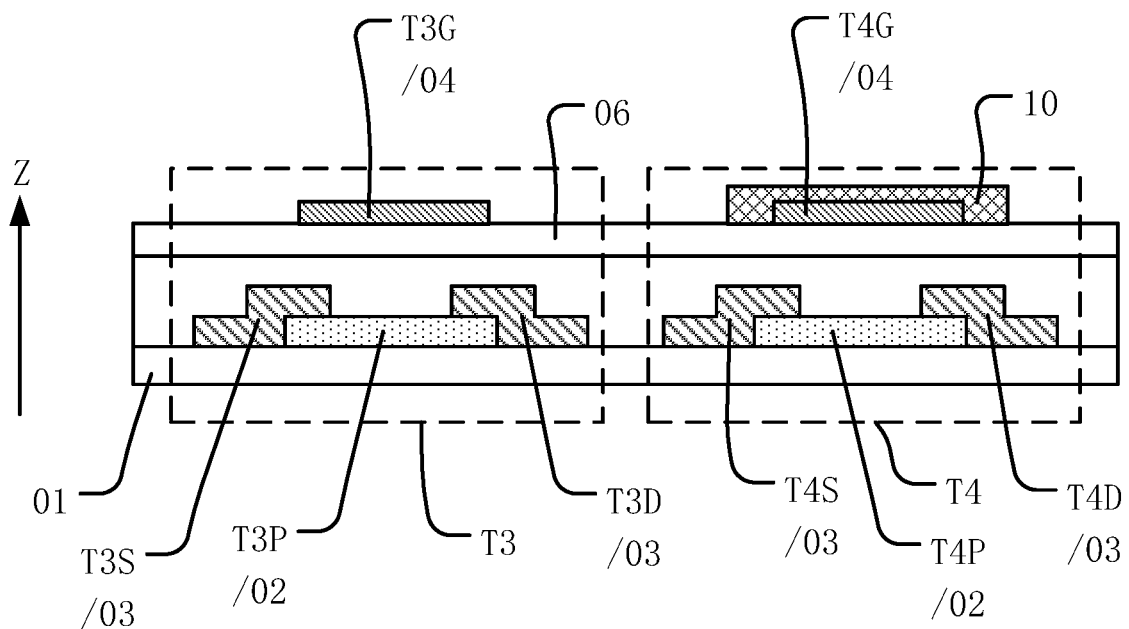
FIG. 6 illustrates another structure of the exemplary device in FIG. 3.

FIG. 6 is another schematic structural diagram of the detection device in FIG. 3. As shown in FIG. 6 and FIG. 3, in this embodiment, a gate T4G may be disposed above the channel of the fourth transistor T4. The gate T4G may be a floating gate.

The fourth transistor T4 may also include a gate T4G, and the gate T4G may be disposed above the channel of the fourth transistor T4. The gate T4G may be fabricated with the gates of the other three transistors in the same layer and the same material and process. Accordingly, when the four transistors are in a same environment during the detection process, the fluctuations of the characteristics of the four transistors themselves may be kept synchronized, thereby improving the detection accuracy. In this embodiment, the gate T4G of the fourth transistor T4 may be set to be floating, for example, the gate T4G of the fourth transistor T4 may not be electrically connected to any potential, thus the gate T4G of the fourth transistor T4 that is not electrically connected to any potential signal may not affect the use of the ion-sensitive membrane 10. Thus, while making the four transistors to have the same structure, it may also be beneficial to improve the accuracy of the detection result.

In one embodiment, when the floating gate T4G is disposed above the channel of the fourth transistor T4, the ion-sensitive membrane 10 may be located on the side of the gate T4G of the fourth transistor T4 away from the substrate 01. For example, during the detection, the ion-sensitive membrane 10 may be closer to the detection solution. Accordingly, the detection effect may be ensured.

In another embodiment, the ion-sensitive membrane 10 may be in direct contact with the gate T4G of the fourth transistor T4. When the ion-sensitive membrane 10 contacts the ions of the to-be-detected solution, for example, the ion-sensitive membrane 10 may be sensitive to hydrogen ions, then the potential of the surface of the ion-sensitive membrane 10 may change when it contacts with the hydrogen ions in the solution. Because the gate T4G of the fourth transistor T4 may be in direct contact with the ion-sensitive membrane 10, the gate T4G of the fourth transistor T4 may also be turned from floating to a specific potential. For example, the original floating potential of the gate T4G of the fourth transistor T4 may change, and the gate T4G of the fourth transistor T4 may be used as a to-be-detected potential terminal at this time.

In some embodiments, referring to FIG. 3 and FIG. 6, the first transistor T1, the second transistor T2, the third transistor T3 and the fourth transistor T4 may all be top-gated transistors. That is, through the top-gates transistors, the gates may be only disposed above the channel of the transistors, when the gates of the first transistor T1, the second transistor T2, and the third transistor T3 are electrically connected to a constant potential or an adjustable potential to perform a calibrated detection, they may also play a shielding role. The gate of the fourth transistor T4 may be configured as the to-be-detected potential terminal with the potential change. After the ions of the to-be-detected solution reacts with the ion-sensitive membrane 10 above the channel of the fourth transistor T4, the generated potential change may be fed back to other structures of the detection device 000 to realize the detection of the ion concentration. The detection unit 00 formed by the transistors of the top-gated structure in this embodiment may be beneficial to improve the detection accuracy, and may also make the design structure and detection method relatively simple, which may be easy to improve the process efficiency and the detection efficiency.

Further, referring to FIG. 3 and FIG. 6, in one embodiment, the constant potential electrically connected to the first voltage signal terminal G1 electrically connected to the gate T1G of the first transistor T1 and the second voltage signal electrically connected to the second voltage signal terminal G2 electrically connected the gate T2G of the second transistor T2 may be same. Because the gates, sources and drains of the first transistor T1 and the second transistor T2 may have the same structure and be made of a same material, and the detection environment may be the same, the constant potential electrically connected to the first voltage signal terminal G1 and the second transistor T2 may be same, the first power supply signal provided by the first power supply terminal VDD electrically connected to the source of the first transistor T1 and the source of the second transistor T2 may be also same. Thus, the output currents of the first transistor T1 and the second transistor T2 can also be kept consistent, which may be beneficial to ensure the stability of the entire detection device 000.

In the detection process of the detection device 000 of this embodiment, the third voltage signal terminal G3 electrically connected to the gate T3G of the third transistor T3 may be configured as the adjustable potential terminal GX, and the gate T4G of the fourth transistor T4 may be configured as the to-be-detected potential terminal P, when the ion-sensitive membrane 10 covered above the channel of the fourth transistor T4 reacts with the ions in the to-be-detected solution and changes the potential of the to-be-detected potential terminal P, the potential of the third voltage signal terminal G3 may be adjusted to make the potential values of the first potential output terminal A and the second potential output terminal B of the detection unit 00 to be equal. That is, although the potential of the to-be-detected potential terminal P changes due to the change of ion concentration, the detection device 000 may self-calibrate such that the potential difference between the first potential output terminal A and the second potential output terminal B may be zero. In such a case, the output currents of the third transistor T3 and the fourth transistor T4 may also be same, the potential of the gate T4G of the fourth transistor T4 (e.g., the potential the to-be-detected potential terminal P) may be understood as the potential of the third voltage signal terminal G3 electrically connected to the gate T3G of the adjusted third transistor T3 at this time, and the desired ion concentration in the to-be-detected solution may be obtained.

Figure 7:
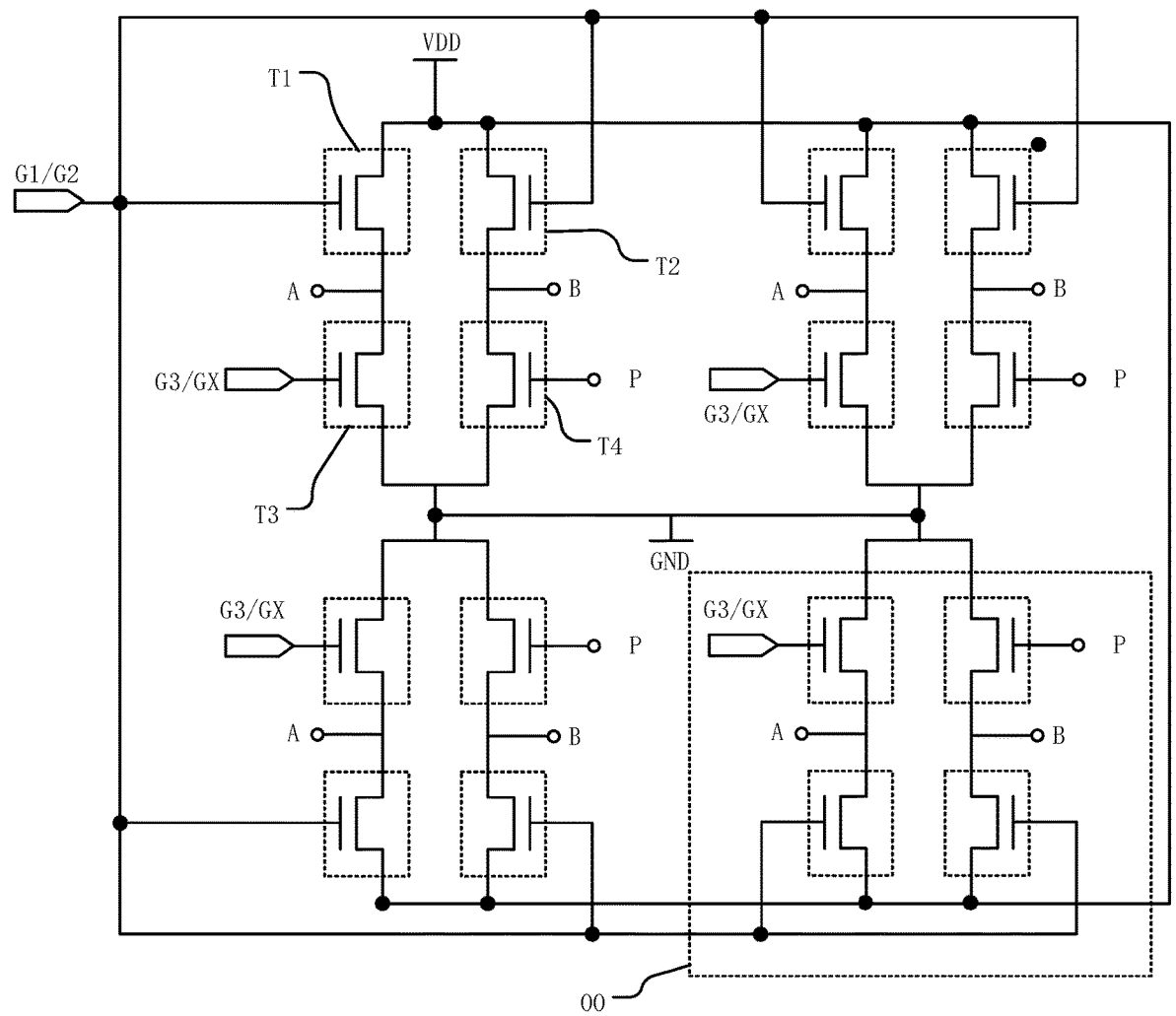
FIG. 7 illustrates a circuit connection structure of another exemplary detection device according to various disclosed embodiments of the present disclosure.

FIG. 7 is a schematic diagram of another circuit connection structure of an exemplary detection device according to various disclosed embodiments. As shown in FIG. 7 and referring to FIG. 3 and FIG. 6, in some embodiments, the detection device 000 may include a plurality of detection units 00 arranged as an array. The first voltage signal terminals G1 of the plurality of detection units 00 may be electrically connected to each other, and the second voltage signal terminals G2 of the plurality of detection units 00 may be electrically connected to each other. The first power supply terminals VDD of the plurality of detection units 00 may be electrically connected to each other. The second power supply terminals GND of the plurality of detection units 00 may be electrically connected to each other.

The detection device 000 may include the plurality of detection units 00. In one embodiment, the plurality of detection units 00 may be arranged as an array on the substrate 01. That is, it can be understood that the four transistors of the detection unit 00 may be as one group; and a plurality of groups of detection units 00 of this connection structure may be distributed on the substrate 01 as an array. In the plurality of detection units 00, the first voltage signal terminals G1 electrically connected to the same constant potential may be electrically connected to each other. The second voltage signal terminals G2 electrically connected to the same constant potential may be electrically connected to each other. In one embodiment, when the constant potentials electrically connected to the first voltage signal terminals G1 and the voltage signal terminals G2 are the same, all the first voltage signal terminals G1 and all the second voltage signal terminals G2 in the plurality of detection units 00 on the detection device 000 may also be electrically connected to one signal line, and the first power supply terminals VDD of the plurality of detection units 00 for providing the first power supply signals may also be electrically connected to one power supply signal line, and the second power supply terminals GND of the plurality of detection units 00 for providing the second power supply signals may also be electrically connected to each other and may be electrically connected to another power signal line. Such a configuration may be beneficial to significantly reduce the number of signal lines, and the volume of the detection device 000 may be reduced, and the manufacturing process may be simplified.

When the detection device 000 includes the plurality of detection units 00, the first power supply terminal VDD and the second power supply terminal GND may be provided with different power supply signals respectively through the two common power signal lines, and at the same time, the first voltage signal terminals G1 and the second voltage signal terminals G2 of all the detection units 00 may be provided a same constant potential through the common signal lines. When detecting the to-be-detected solution, the potential of the third voltage signal terminal G3 of each detection unit 00 may be adjusted sequentially such that the potential difference between the first potential output terminal A and the second potential output terminal B detected by each detection unit may be zero. At this time, when the potential difference between the first potential output terminal A and the second potential output terminal B detected by each detection unit 00 is zero, the potential of the gate T4G of the fourth transistor T4 of each detection unit 00 (i.e., the potential of the to-be-detected potential terminal P) may be equal to the adjusted potential of the third voltage signal terminal G3, that is, the adjusted potential of the third voltage signal terminal G3 of each detection unit 00 at this time may be the required potential of the to-be-detected potential terminal P of each detection unit 00. Then, by taking the average value of the potentials of all the third voltage signal terminals G3 after adjustment in the plurality of detection units 00, the average value of the ion concentration may be obtained by calculation. Thus, the overall detection accuracy of the detection device 000 may be further improved, and the detection precision may be further improved.

It can be understood that FIG. 7 in this embodiment only takes one detection device 000 including four detection units 00 as an example for the schematic illustration, and the specific implementation includes but is not limited to this number, which can be set according to actual detection requirements.

In some embodiments, referring to FIG. 3 and FIG. 6, the gates of the first transistor T1, the second transistor T2, the third transistor T3 and the fourth transistor T4 may be disposed in the same layer and may be made of the same material. The sources and drains of the first transistor T1, the second transistor T2, the third transistor T3 and the fourth transistor T4 may be disposed in a same layer and may be made of a same material. The active regions of the first transistor T1, the second transistor T2, the third transistor T3 and the fourth transistor T4 may be disposed in a same layer and made of a same material.

When each transistor included in the detection device 000 is fabricated on the substrate 01, the gates of the first transistor T1, the second transistor T2, the third transistor T3 and the fourth transistor T4 may be formed in the same layer and by the same process and made of the same material; the sources and drains of the first transistor T1, the second transistor T2, the third transistor T3 and the fourth transistor T4 may be formed on the same layer and by the same process and made of the same material. The active regions of the first transistor T1, the second transistor T2, the third transistor T3 and the fourth transistor T4 may be formed on the same layer and by a same process and made of the same material. Because the four transistors may also be in the same environment during the detection process, the fluctuations of the characteristics of the four transistors themselves may be kept synchronized, and only the gate potential of the fourth transistor T4 used as the detection transistor may be affected by the to-be-detected solution, and the detection device of this embodiment may be used directly without a reference calibration. The detection device may be self-calibrated during the detection process, and the final detection result may have a high reliability.

Figure 8:
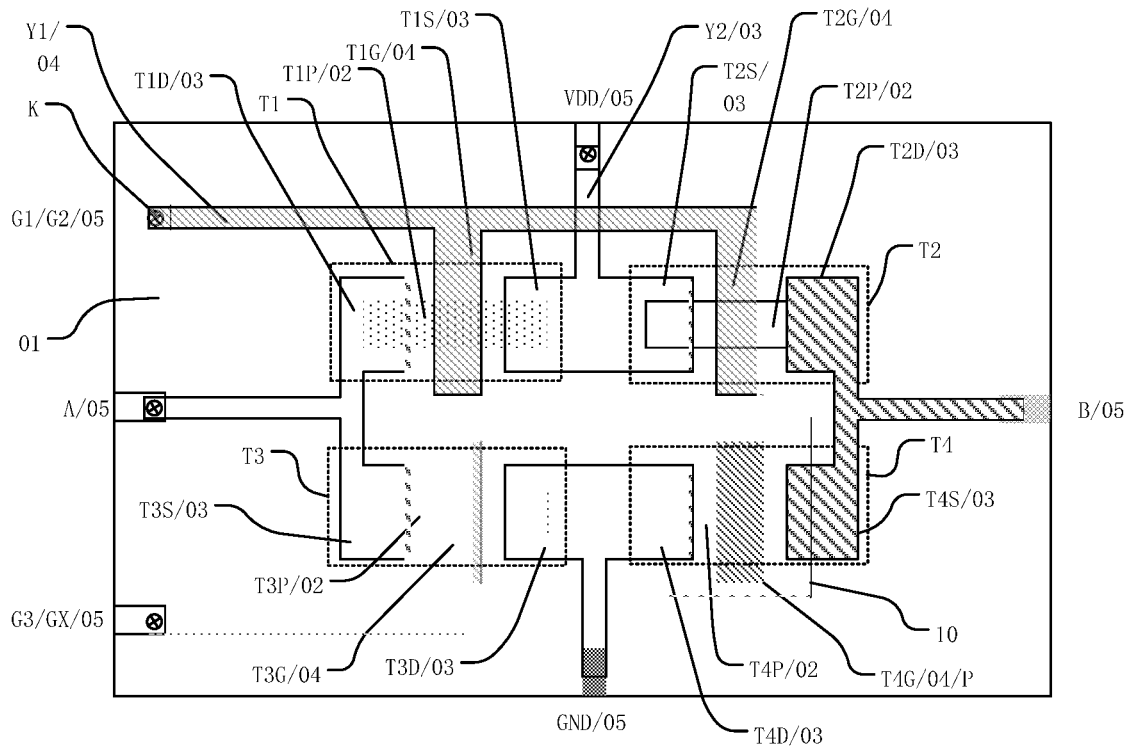
FIG. 8 illustrates a top view of the exemplary detection device in FIG. 6.

FIG. 8 is a schematic top view of the detection device in FIG. 6 (it is understandable that, to clearly illustrate the structure of the embodiment, FIG. 8 is filled with transparency). As shown in FIG. 3, FIG. 6 and FIG. 8, the film layer structure of the detection device 000 may include at least a first substrate 01 (the substrate 01); a first active layer 02 disposed on a side of the first substrate 01. The first active layer 02 may be provided with (may include) the active regions of the first transistor T1, the second transistor T2, the third transistor T3 and the fourth transistor T4.

The detection device 00 may also include a first conductive layer 03 disposed on the side of the first active layer 02 facing away from the first substrate 01. The second conductive layer 03 may be provided with the sources and drains of the first transistor T1, the second transistor T2, the third transistor T3 and the fourth transistor T4.

The detection device 00 may also include a second conductive layer 04 disposed on the side of the first conductive layer 03 facing away from the first substrate 01. The second conductive layer 04 may be provided with (or may include) the gates of the first transistor T1, the second transistor T2, the third transistor T3 and the fourth transistor T4.

This embodiment explains the schematic diagram of the film layer structure of each transistor of the detection device 000 fabricated on the first substrate 01 such that different structures of the four transistors fabricated with the same layer of material and by the same process may be realized. Accordingly, the fluctuations of the characteristics of the four transistors themselves may be kept synchronized, making the final detection result more reliable.

In one embodiment, each signal terminal of the detection device 000 may be disposed on the sixth conductive layer 05, and the sixth conductive layer 05 may be disposed on the side of the first active layer 02 adjacent to the first substrate 01 (not shown in FIG. 6). For example, the first voltage signal terminal G1, the second voltage signal terminal G2, the third voltage signal terminal G3, the first power supply terminal VDD, the second power supply terminal GND, the first potential output terminal A, and the second potential output terminal B may all be disposed on the sixth conductive layer 05 to avoid affecting the structure of the transistors of other conductive layers, and to effectively avoid the occurrence of short circuits. At the same time, it may also make each signal terminal of the detection device 000 and the electrically connected signal lines, detection lines, etc., to be away from the to-be-detected solution as far as possible to avoid affecting the detection sensitivity of the ion-sensitive membrane 10.

In some embodiments, as shown in FIG. 8, the first voltage signal terminal G1, the second voltage signal terminal G2, the third voltage signal terminal G3, the first power supply terminal VDD, the second power supply terminal GND, the first potential output terminal A, and the second potential output terminal B may all be disposed at the periphery of the entire detection device 000, i.e., the region of the first substrate 01 adjacent to the outer edge, Accordingly, the effect of the disposition of the first voltage signal terminal G1, the second voltage signal terminal G2, the third voltage signal terminal G3, the first power supply terminal VDD, the second power supply terminal GND, the first potential output terminal A, and the second potential output terminal B on the contact between the transistor and the to-be-detected solution, thereby affecting the detection effect, may be avoided.

Further, as shown in FIG. 8, because the first voltage signal terminal G1, the second voltage signal terminal G2, the third voltage signal terminal G3, the first power supply terminal VDD, the second power supply terminal GND, the first potential output terminal A, the second potential output terminal B may be disposed in the sixth conductive layer 05, and the gates, sources, and drains, etc. of the transistors electrically connected to these terminals may be disposed in other conductive layers, a via K may be formed between the two conductive layers to realize the electrical connection between each terminal and different conductive layers. It can be understood that this embodiment does not specifically limit the opening position of the via K, and only needs to satisfy that the layout does not affect the transistor itself. For example, a plurality of vias K may be arranged at the periphery of the entire detection device 000, that is, the region of the first substrate 01 adjacent to the outer edge, such that the arrangement of the vias K the affect of the disposition of the vias K on the detection accuracy may be avoided.

For example, a common first voltage signal terminal G1 and a second voltage signal terminal G2, the gate T1G of the first transistor T1 and the gate T2G of the second transistor T2 included in the sixth conductive layer 05 may be electrically connected together in the second conductive layer 04, and then may extend to the periphery of the detection device 000 through a first extension member Y1. Accordingly, in the direction perpendicular to the plane of the first substrate 01, the first extension member Y1 on the second conductive layer 04 and the common first voltage signal terminal G1 and the second voltage signal terminal G2 on the sixth conductive layer 05 may at least partially overlap, and then the gate T1G of the first transistor T1 and the gate T2G of the second transistor T2 may both electrically connected to the first voltage signal terminal G1 through the via K.

For example, the first power supply terminal VDD, the source electrode T1S of the first transistor T1 and the source electrode T2S of the second transistor T2 included in the sixth conductive layer 05 may be electrically connected together in the first conductive layer 03 and then extended through a second extension member Y2 to the periphery of the detection device 000. Accordingly, in the direction perpendicular to the plane of the first substrate 01, the second extension member Y2 on the first conductive layer 03 and the first power supply terminal VDD on the sixth conductive layer 05 may at least partially overlap. Then, the source T1S of the first transistor T1 and the source T2S of the second transistor T2 may be both electrically connected to the first power supply terminal VDD through the via hole K. The settings of the other signal terminals may be illustrated with reference to FIG. 8, which will not be repeated in this embodiment.

Further, in some embodiments, the sixth conductive layer 05 may also be used to dispose the signal lines respectively electrically connected with the first voltage signal terminal G1 (the second voltage signal terminal G2), the third voltage signal terminal G3, the first power supply terminal VDD, and the second power supply terminal GND, the first potential output terminal A and the second potential output terminal B (not shown in the figure). Each signal line may be disposed in the peripheral region of the four transistors. For example, the orthographic projections of the signal lines on the first substrate 01 do not overlap with each of the four transistors. Thus, the effect of the sixth conductive layer 05 on the detection effect of the detection unit 00 may be avoided.

Figure 9:
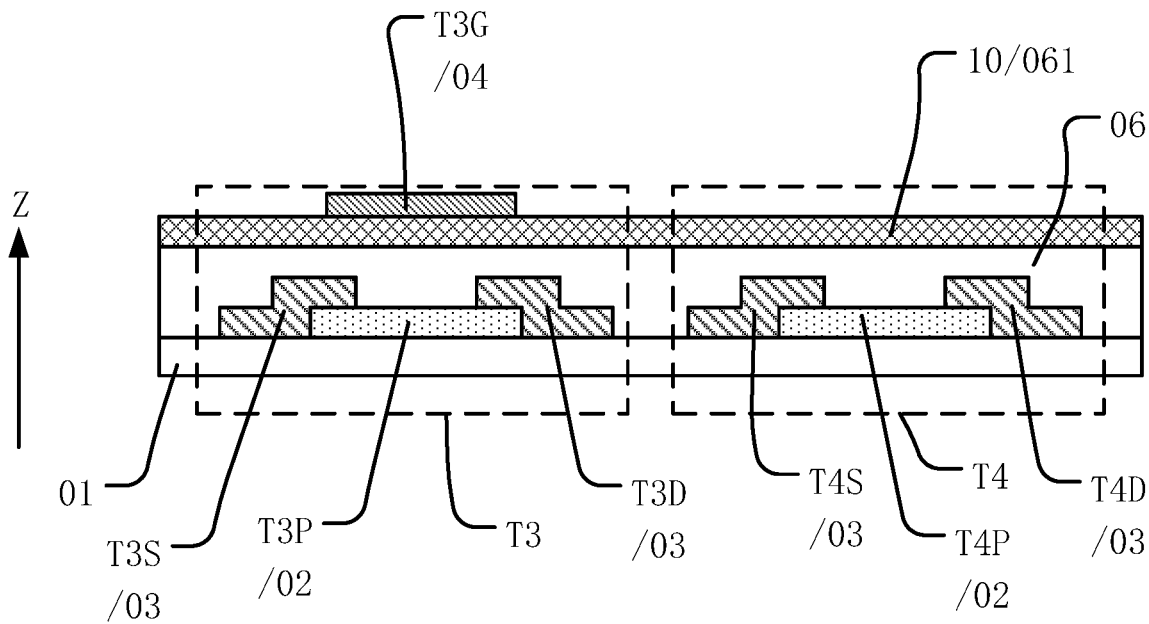
FIG. 9 illustrates another structure of the exemplary device in FIG. 3.

FIG. 9 is another schematic structural diagram of the detection device in FIG. 3. As shown in FIG. 9 and referring to FIG. 3, in some embodiments, the insulation layer 06 between the first conductive layer 03 and the second conductive layer 04 may include at least a first insulation layer 061. The first insulation layer 061 may be made of silicon oxide, and the first insulation layer 061 may be multiplexed as the ion-sensitive membrane 10.

In one embodiment, the first insulation layer 061 may be an insulation layer between the first conductive layer 03 and the second conductive layer 04 and in contact with the second conductive layer 04. For example, comparing with other insulation layers between first conductive layer 03 and the second conductive layers 04, the first insulation layer may be closer to the second conductive layer 04.

The first insulation layer 061 between the first conductive layer 03 for forming the source and drain of the transistor and the second conductive layer 04 for forming the gate of the transistor may be made of silicon oxide. In one embodiment, the first insulation layer 061 may be made of PA-SiO$_x$. PA-SiO$_x$ may refer to a thin layer of silicon oxide consisting of SiO$_x$ coated on the substrate of PA material (polyamide). Since PA-SiO$_x$ may be more sensitive to hydrogen ions, when the concentration of hydrogen ions in the to-be-detected solution, i.g., pH value, needs to be detected, the surface of PA-SiO$_x$ may adsorb hydrogen ions and react with hydrogen ions such that the amount of charges on the surface of the portion of the first insulation layer 061 above the channel of in the fourth transistor T4 may change. Thus, the first insulation layer 061 made of silicon oxide may be multiplexed as the ion-sensitive membrane 10. For example, the first insulation layer 061 disposed between the first conductive layer 03 and the second conductive layer 04 in this embodiment may not only insulate the first conductive layer 03 from the second conductive layer 04, but also may be multiplexed as the ion-sensitive membrane 10 during forming the first insulation layer 061 using silicon oxide. Further, the first insulation layer 061 disposed above the channel of the fourth transistor T4 may realize the detection of the hydrogen ion concentration in the to-be-detected solution. Accordingly, the process steps may be simplified, and the overall thickness of the detection device may be reduced.

It can be understood that, as shown in FIG. 9, when the first insulation layer 061 between the first conductive layer 03 and the second conductive layer 04 in this embodiment is made of silicon oxide, and multiplexed as the ion-sensitive membrane 10 sensitive to hydrogen ions, the first insulation layer 061 above the channel of the fourth transistor T4 may be exposed. The hydrogen ions in the solution may accumulate on the surface of the first insulation layer 061 above the channel of the fourth transistor T4. Through the first insulation layer 061 that is exposed and multiplexed as the ion-sensitive membrane 10, the hydrogen ions in the solution may fully react with the ion-sensitive membrane 10 above the channel of the fourth transistor T4. Accordingly, while the concentration of hydrogen ions in the to-be-detected solution is detected, the thin design of the detection device may be facilitated.

In some embodiments, referring to FIG. 3 and FIG. 4, the ion-sensitive membrane 10 may be disposed on the side of the second conductive layer 04 away from the first substrate 01. It is understood that, in the manufacturing process, after each structure of the second conductive layer 04 is fabricated, the ion-sensitive membrane 10 may be fabricated on the side of the second conductive layer 04 facing away from the first substrate 01.

This embodiment explains that the ion-sensitive membrane 10 may also be disposed on the side of the second conductive layer 04 facing away from the first substrate 01. The first insulation layer 06 between the first conductive layer 03 and the second conductive layer 04 may be made of other insulating materials, and the first insulation layer 06 and the ion-sensitive membrane 10 may be independent of each other. The ion-sensitive membrane 10 may be additionally disposed on the side of the second conductive layer 04 facing away from the first substrate 01. The ion sensitive membrane 10 may be a material sensitive to hydrogen ions or other ions. At this time, the ion-sensitive membrane 10 above the channel of the fourth transistor T4 may still be exposed to fully react with the ions in the solution. The gates of the first transistor T1, the second transistor T2, and the third the transistor T3 may be made from the second conductive layer 04 to facilitate access to a constant potential and an adjustable potential signal. Accordingly, while achieving the detection function, the influence of the ions in the to-be-detected solution on the gate potentials of the three transistors may be avoided through the shielding effect of the first transistor T1, the second transistor T2, and the third transistor T3.

It should be noted that the material of the second conductive layer 04 may be any one of conductive metal or indium tin oxide semiconductor transparent conductive film, which is not specifically limited in this embodiment. The material of the second conductive layer 04 may be selected according to the practical applications.

In some embodiments, referring to FIG. 3 and FIG. 4, in the direction Z perpendicular to the plane where the first substrate 01 is located, the ion-sensitive membrane 10 overlaps the channel of the fourth transistor T4. That is, the ion-sensitive membrane 10 may be coated only over the channel of the fourth transistor T4. Thus, the material for forming the ion-sensitive membrane 10 may be saved, and the manufacturing cost may be reduced.

In some embodiments, referring to FIG. 3 and FIG. 5, the ion-sensitive membrane 10 may have a full-surface structure on the side of the second conductive layer 04 facing away from the first substrate 01. That is, the ion-sensitive membrane 10 may be the structure covering the entire surface above the second conductive layer 04. Such a configuration may be beneficial to reduce the difficulty of the process and may facilitate the fabrication of the ion-sensitive membrane 10. Further, because the gate of the first transistor T1, the gate of the second transistor T2, and the gate of the third transistor T3 may be electrically connected to a constant potential or an adjustable potential, which is equivalent to the gate of the first transistor T1, the gate of the second transistor T2 and the gate of the third transistor T3 may have a shielding effect, even if the ion-sensitive membrane 10 covers the gates of the first transistor T1, the second transistor T2 and the third transistor T3, the shielding effect may prevent the ions in the to-be-detected solution from affecting the gate potentials of the three transistors.

Figure 10:
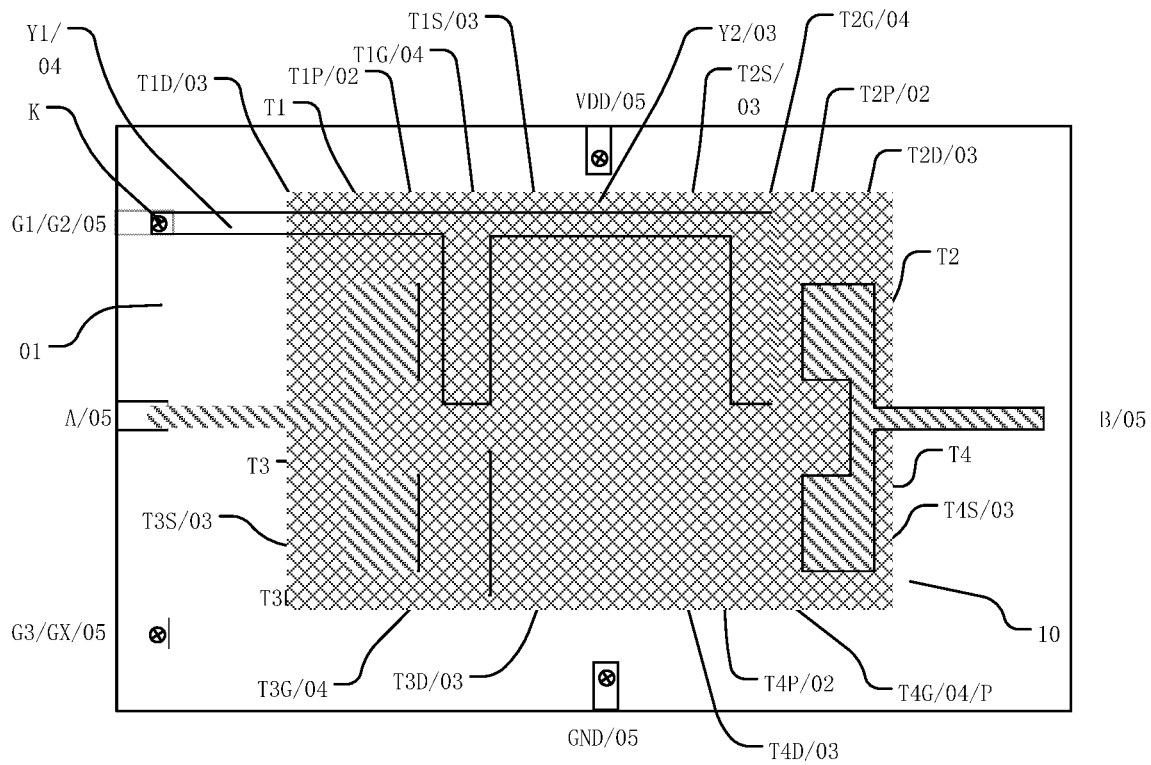
FIG. 10 illustrates a top view of another exemplary detection device according to various disclosed embodiments of the present disclosure.

FIG. 10 is another top-view of an exemplary detection device according to various disclosed embodiments of the present disclosure (it can be understood that, to clearly illustrate the structure of this embodiment, FIG. 10 is filled with transparency). As shown in FIG. 10 and referring to FIG. 5, in one embodiment, the ion-sensitive membrane 10 may have a whole-surface structure, and the ion-sensitive membrane 10 may cover all the first transistors T1, the second transistors T2, the third transistors T3 and the fourth transistors T4 in the detection device 000. That is, no matter how many detection units 00 the detection device 000 includes, the ion-sensitive membrane 10 may be a large-sized whole-surface structure without any patterning process, and may cover all the first transistors T1, the second transistors T2, the third transistors T3 and the fourth transistors T4 on the whole surface of the detection device 000. The shape of the large-sized ion-sensitive membrane 10 of the whole-surface structure may be appropriately adjusted according to the overall shape or size of the detection device 000. For example, it may be narrower than the first substrate 01 of the detection device (as shown in FIG. 10), it may also be beyond the edge of the first substrate 01 of the detection device (not shown), which is not specifically limited in this embodiment. Such a configuration may be beneficial to reduce the difficulty of the manufacturing process of the ion-sensitive membrane 10, and may improve process efficiency.

In some embodiments, referring to FIG. 3 and FIG. 4, in the detection device 000, the active layer of the first transistor T1, the active layer of the second transistor T2, the active layer of the third transistor T3 and the active layer of the fourth transistor T4 may be made of an oxide semiconductor. For example, the first active layer 02 may be made of the oxide semiconductor.

This embodiment explains that among the four transistors included in the detection unit 00 of the detection device 000, the materials of the active layers of the transistors may all be made of oxide semiconductors, such as amorphous indium gallium zinc oxide (IGZO). For example, the four transistors may all be IGZO transistors. Comparing with silicon semiconductor transistors, oxide semiconductor transistors may be more sensitive to hydrogen, water and oxygen. Thus, the active regions of the four transistors in this embodiment made of oxide semiconductor may not only to improve the detection sensitivity of the fourth transistor T4, but also ensure that the fluctuations of the characteristics of the four transistors themselves may be synchronized when they are in the same environment during the detection process. Accordingly, the detection accuracy may be further improved.

Figure 11:
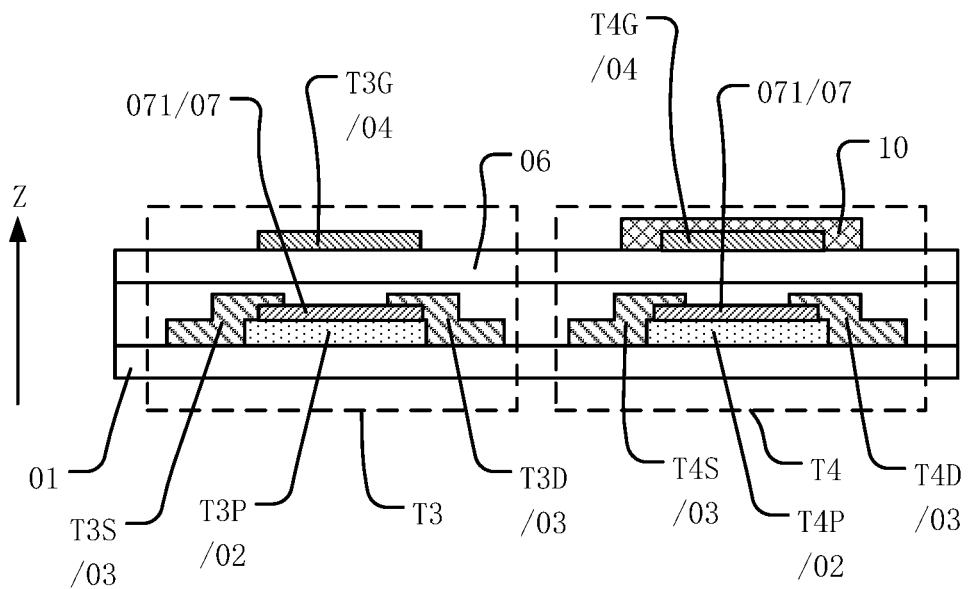
FIG. 11 illustrates another structure of the exemplary device in FIG. 3.
Figure 12:
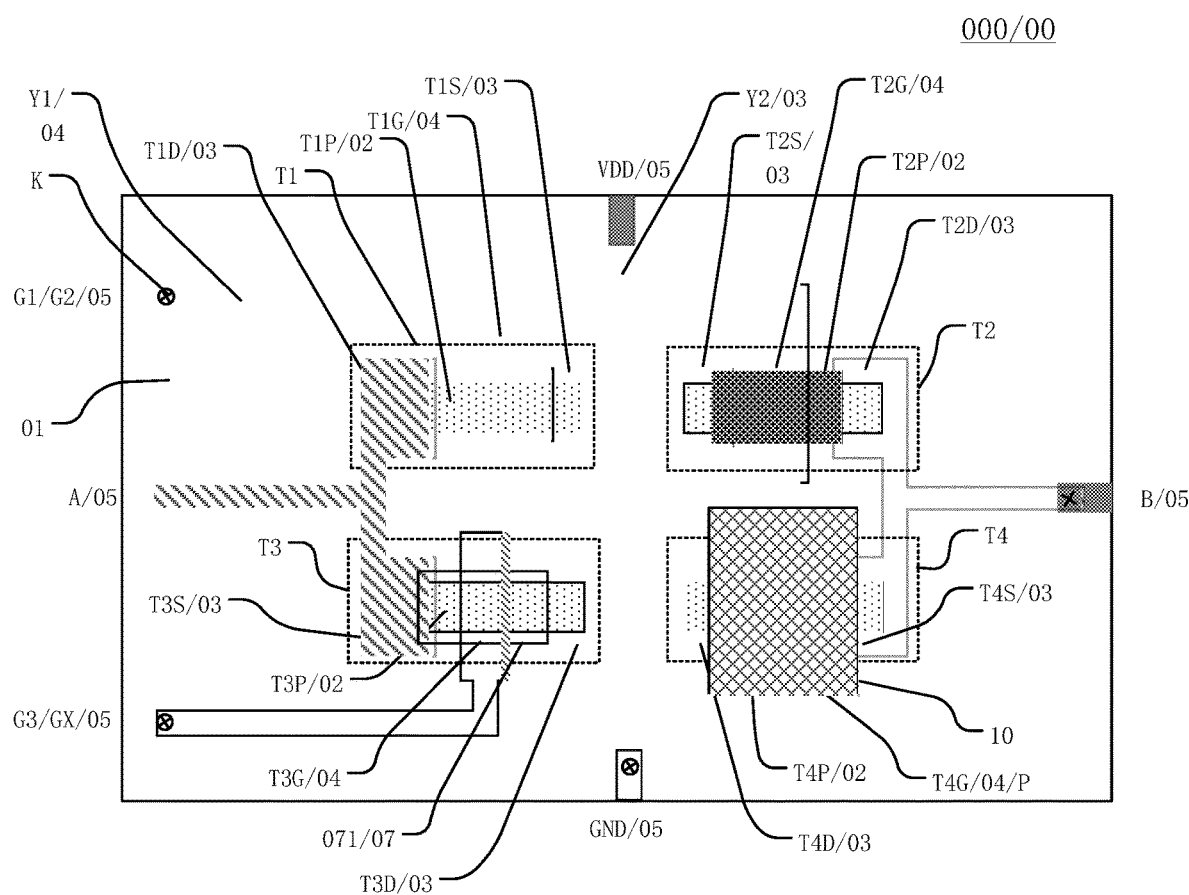
FIG. 12 illustrates a top view of the exemplary detection device in FIG. 11.

FIG. 11 is another schematic structural diagram of the detection device in FIG. 3, and FIG. 12 is a top view of the detection device in FIG. 11 (it should be understood that, to clearly illustrate the structure of this embodiment, FIG. 12 is filled with transparency). As shown in FIGS. 11-12 and referring to FIG. 3, in some embodiments, the first substrate 01 may further include an etching stop layer 07. The etching stop layer 07 may be disposed on the side of the active layer 02 facing away from the first substrate 01. The etching stop layer 07 may include an etching stop portion 071.

In the direction Z perpendicular to the plane where the first substrate 01 is located, the etching stop portion 071 may be at least electrically connected to the active region of the first transistor T1, the active region of the second transistor T2, the active region of the third transistor T3, and the active region of the fourth transistor T4.

This embodiment explains that when the active regions of all transistors in the detection device 000 are made of oxide semiconductors, because the oxide semiconductor may be very sensitive to the process and the environment, to prevent the subsequent fabrication process and environment of the first active layer 02 from affecting the performance of the active regions of the transistors, the etching stop layer 07 may disposed on the side of the first active layer 02 facing away from the first substrate 01. The etching stop layer 07 may include the etching stop portion 071. In the direction Z perpendicular to the plane where the first substrate 01 is located, the etching stop portion 071 may at least overlaps the active regions of all transistors. In one embodiment, in the direction Z perpendicular to the plane where the first substrate 01 is located, the etching stop portion 071 may cover at least the active region of the transistors within the channel ranges to protect the active regions of the transistors and avoid the subsequent process from affecting the sensitivity of the active regions of the transistors made of oxide semiconductor material. Accordingly, the detection sensitivity may be improved.

Figure 13:
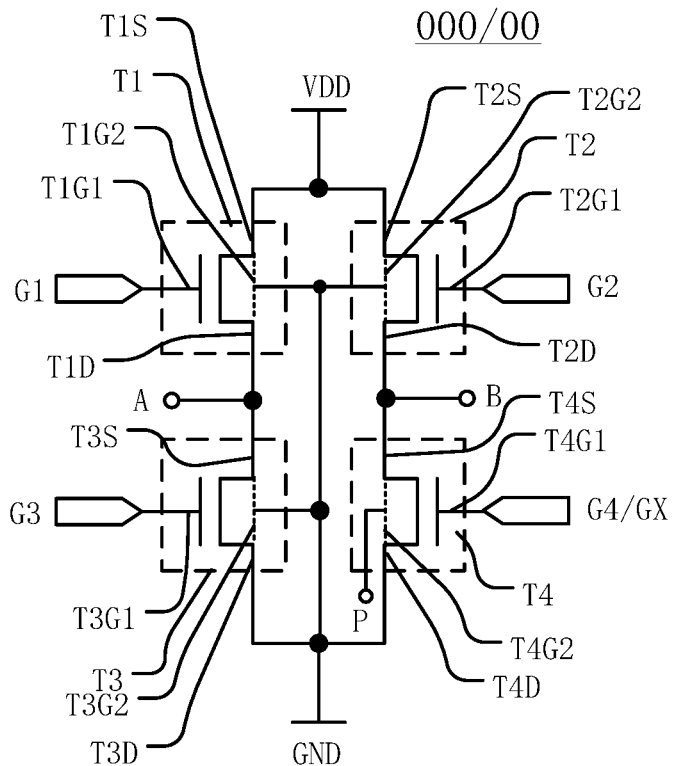
FIG. 13 illustrates a circuit connection structure of another exemplary detection device according to various disclosed embodiments of the present disclosure.
Figure 14:
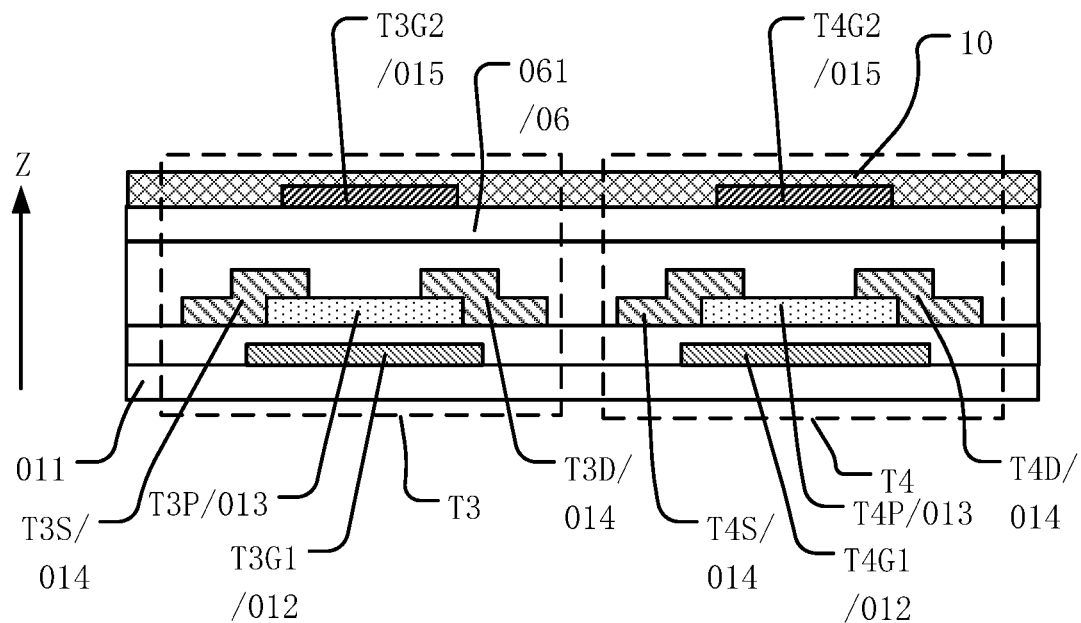
FIG. 14 illustrates a structure of the exemplary detection device in FIG. 13.

FIG. 13 is a schematic diagram of another circuit connection structure of an exemplary detection device according to various disclosed embodiments of the present disclosure, and FIG. 14 is a schematic structural diagram of the detection device in FIG. 13. As shown in FIGS. 13-14, in one embodiment, a detection device 000 may include at least one detection unit 00. The first transistor T1, the second transistor T2, the third transistor T3 and the fourth transistor T4 in the detection unit 00 may all be dual-gate transistors.

The first voltage signal terminal G1 may be electrically connected to the bottom gate T1G1 of the first transistor T1, the second voltage signal terminal G2 may be electrically connected to the bottom gate T2G1 of the second transistor T2, the third voltage signal terminal G3 may be electrically connected to the bottom gate T3G1 of the third transistor T3, and the fourth voltage signal terminal G4 may be electrically connected to the bottom gate T4G1 of the fourth transistor T4.

The top gate T1G2 of the first transistor T1, the top gate T2G2 of the second transistor T2 and the top gate T3G2 of the third transistor T3 may all be electrically connected to the second power supply terminal GND, and the top gate of the fourth transistor T4 may be floating. It can be understood that FIG. 14 only shows the third transistor T3 and the fourth transistor T4, and the film structure of the first transistor T1 and the second transistor T2 may be understood with reference to the structure of the third transistor T3.

This embodiment explains that the first transistor T1, the second transistor T2, the third transistor T3 and the fourth transistor T4 in the detection unit 00 may all be dual-gate transistors. Through the dual-gate transistors, not only top gates may be disposed above the channels of the transistors, but also the top gate T1G2 of the first transistor T1, the top gate T2G2 of the second transistor T2, and the top gate T3G2 of the third transistor T3 may all be electrically connected to the second power supply terminal GND. Being electrically connected to the constant potential provided by the second power supply terminal GND may play a better shielding role, and may further prevent the ions in the to-be-detected solution from affecting the performance of the three transistors. Further, the first voltage signal terminal G1 may be electrically connected to the bottom gate T1G1 of the first transistor T1, the second voltage signal terminal G2 may be electrically connected to the bottom gate T2G1 of the second transistor T2, the third voltage signal terminal G3 may be electrically connected to the bottom gate T3G1 of the third transistor T3, and the fourth voltage signal terminal G4 may be electrically connected to the bottom gate T4G1 of the fourth transistor T4. Each voltage signal terminal electrically connected by the bottom gates of the four transistors may play the role of self-calibration of the transistor, and then through the self-calibration of the detection device, the detection accuracy and stability of the detection device may be further improved.

In one embodiment, as shown in FIG. 13 and FIG. 14, the first voltage signal terminal G1 and the second voltage signal terminal G2 may be electrically connected to the same constant potential, and the third voltage signal terminal G3 may be electrically connected to the second constant potential. The fourth voltage signal terminal G4 may be the adjustable potential terminal GX, and the top gate T4G2 of the fourth transistor T4 may be floating, that is, may be configured as the to-be-detected potential terminal P.

This embodiment explains that the top gate T4G2 of the fourth transistor T4 is used as the to-be-detected potential terminal P with the potential change, and the fourth voltage signal terminal G4 electrically connected to the bottom gate T4G1 of the fourth transistor T4 may be configured as the adjustable potential terminal GX. During the detection process, the first voltage signal terminal G1 and the second voltage signal terminal G2 may be electrically connected to a first constant potential respectively, and the third voltage signal terminal G3 may be electrically connected to a second constant potential different from the first constant potential, and the detection device 000 may be placed in the to-be-detected solution. Because the ion-sensitive membrane 10 may be disposed above the channel of the fourth transistor T4, when the ion-sensitive membrane 10 contacts the ions in the to-be-detected solution, for example, if the ion-sensitive membrane 10 is sensitive to hydrogen ions, the ion-sensitive membrane 10 may contact the hydrogen ions in the solution, the potential of the surface of the ion-sensitive membrane 10 may change. Thus, the potential of the top gate T4G2 of the fourth transistor T4 may change, that is, the potential of the to-be-detected potential terminal P may change. At this time, the potential of the fourth voltage signal terminal G4 used as the adjustable potential terminal GX may be adjusted to cause the potential values of the first potential output terminal A and the second potential output terminal B to be equal, that is, the potential difference between the first potential output terminal A and the second potential output terminal B may be 0. When the voltage difference between the first potential output terminal A and the second potential output terminal B is zero, the difference of the potential values between the third voltage signal terminal G3 and the fourth voltage signal terminal G4 may be calculated at this time; and according to the potential difference between the third voltage signal terminal G3 and the fourth voltage signal terminal G4, the voltage variation of the to-be-detected potential terminal P may be calculated and obtained, and then according to the voltage variation of the to-be-detected potential terminal P, the concentration of the to-be-detected solution may be obtained by calculation.

In the detection process of the detection unit 00 of this embodiment, when the potential values of the first potential output terminal A and the second potential output terminal B are equal, it may be considered that the output currents of the third transistor T3 and the fourth transistor T4 are also same. Therefore, the shift amount of the threshold voltage of the fourth transistor T4 may be consistent with the potential difference between the third voltage signal terminal G3 and the fourth voltage signal terminal G4 at this time.

For a transistor, when Vgs>Vth and Vgs−Vth<Vds, the transistor is in a saturated state, and when the transistor is in a saturated state, the output current of the transistor $Ids=\frac{1}{2}\mu Cox \times W/L \ (Vgs-Vth)^2$. $\mu$ is the mobility of the active region of the transistor, Cox is the capacitance of the gate insulation layer of the transistor, and W/L is the channel width-to-length ratio of the transistor. $\mu$, Cox, and W/L are related to the design and related to the process structure. Vth is the threshold voltage of the transistor, Vgs is the voltage difference between the gate and the source of the transistor, and Vds is the voltage difference between the source and the drain of the transistor. In this embodiment, the detection device 000 may be placed into the to-be-detected solution to detect the ion concentration. By adjusting the potential of the fourth voltage signal terminal G4 used as the adjustable potential terminal GX, the potential difference between the first potential output terminal A and the second potential output terminal B may adjusted to be 0. At this time, because the structures and environments of the first transistor T1 and the second transistor T2 in this embodiment may be same, the voltage values of the bottom gate of the first transistor T1 and the bottom gate of the second transistor T2 may be same. The voltage values of the top gate of the first transistor T1 and the top gate of the second transistor T2 may be same, the voltage values of the source of the first transistor T1 and the source of the second transistor T2 may be same. Thus, the output current of the first transistor T1 may also be consistent with the output current of the second transistor T2, and the voltage values detected by the first potential output terminal A and the second potential output terminal B may be same, and the corresponding current between the first potential output terminal A and the second potential output terminal B may be 0. Therefore, it may be considered that the currents of the third transistor T3 and the fourth transistor T4 may also be same, the currents of the two transistors may be same, the structures may be same, and the environments may be the same. According to $Ids=\frac{1}{2}\mu\, Cox \times W/L\, (Vgs-Vth)^2$, the Vgs–Vth of the third transistor T3 and the fourth transistor T4 may also be same, and the voltage difference Vgs between the gate and the source of the third transistor T3 may be equal to the potential difference between the potential VG3 of the third voltage signal terminal G3 and the first potential output terminal A, the voltage difference Vgs between the gate and the source of the fourth transistor T4 may be equal to the potential difference between the potential VG4 of the adjusted fourth voltage signal terminal G4 and the second potential output terminal B at this time, and the potential of the first potential output terminal A is equal to the potential of the second potential output terminal B. Therefore, by calculating the difference between the potential VG3 of the third voltage signal terminal G3 and the potential VG4 of the adjusted fourth voltage signal terminal G4, the threshold voltage difference Vth may be obtained, that is, the threshold voltage drift ΔVth of the fourth transistor T4 may be obtained. According to the threshold voltage drift ΔVth, the voltage variation ΔVp of the to-be-detected potential terminal P may be obtained. $\Delta Vth=\Delta Vp \times Cis/Cbg$. Cis is the capacitance of the insulation layer of the top gate of the fourth transistor T4. Cbg the capacitance of the insulation layer of the bottom gate of the fourth transistor T4. The insulation layer of the bottom gate of the fourth transistor T4 may be located between the bottom gate T4G1 of the fourth transistor T4 and the active region T4P of the fourth transistor T4, and the insulation layer of the top gate of the fourth transistor T4 may be located between the top gate T4G2 of the fourth transistor T4 and the active region T4P of the fourth transistor T4; and $\Delta Vp=\Delta Vth \times Cbg/Cis$. The relationship between the potential of the to-be-detected potential terminal P and the concentration of the ions may be related to the to-be-detected substance. If the hydrogen ion concentration or pH value is detected, then theoretically $\Delta Vp=58\ mV/pH \times \Delta pH$, and then the hydrogen ion concentration of the to-be-detected solution may be calculated. It can be understood that in this embodiment, according to the different to-be-detected substances, the relationship between the potential of the to-be-detected potential terminal P and the ion concentration may also be different, which may not mean that the potential relationship between all ion concentrations and the to-be-detected potential terminal P is all 58 mV/pH. During the specific implementation, it should be understood with reference to the equation relationship in the related art, which will not be repeated in this embodiment.

In this embodiment, four transistors with the same structure may be electrically connected to each other, and only one of the four transistors may need to be used as the detection transistor. Because the four transistors may be formed by a same process on a same substrate, and they may be in a same environment during the detection process, the fluctuations of the characteristics of the transistors themselves may be kept synchronized, and only the potential of the top gate T4G2 of the fourth transistor T4 used as a detection transistor may be affected by the to-be-detected solution, and the effect to the potential may have nothing to do with the influence of other factors of the transistors, but may only be related to the ion concentration in the solution. Further, the first potential output terminal A and the second potential output terminal B may have no external output current, the potentials of the first potential output terminal A and the second potential output terminal B may not be affected by the to-be-detected solution. Thus, the reliability of the potentials of the first potential of the output terminal A and the second potential output terminal B may be relatively high. In addition, the self-calibration of the detection device may also be performed by the potential of the bottom gates of the four transistors, which may be used in batches, and the error of the final detection result may be substantially small. Thus, the detection accuracy and the stability of the detection device may be improved.

It can be understood that, as shown in FIG. 14, the channel of the fourth transistor T4 in this embodiment may be covered with the ion-sensitive membrane 10, and the ion-sensitive membrane 10 may be located on a side of the top gate T4G2 of the fourth transistor T4 facing away from the substrate 01. On the one hand, this embodiment does not specifically limit the size and shape of the ion-sensitive membrane 10, and may only needs to meet the condition that, when the potential of the ion-sensitive membrane 10 is changed by the change of the ion concentration, the potential of the to-be-detected potential terminal P electrically connected with the top gate T4G2 of the fourth transistor T4 may also be changed. For example, the ion-sensitive membrane 10 may be in contact with the top gate T4G2 of the floating fourth transistor T4.

It should be noted that FIG. 13 and FIG. 14 only illustrate the circuit connection relationship structure and the film layer structure of the transistors. In the practical implantation, a plurality of signal lines may also be disposed on the substrate 02 of the detection device 000. For example, a signal line for providing a constant potential for the first voltage signal terminal G1, the second voltage signal terminal G2, and the third voltage signal terminal G3, a signal line for providing a power supply signal for the first power supply terminal VDD and the second power supply terminal GND, and a signal transmission line used to detect the potential of the first potential output terminal A and the potential of the second potential output terminal B. The specific disposition portions may be set according to the practical requirements, and as long as the structures of the plurality of signal lines on the substrate do not affect the detection performance.

Figure 15:
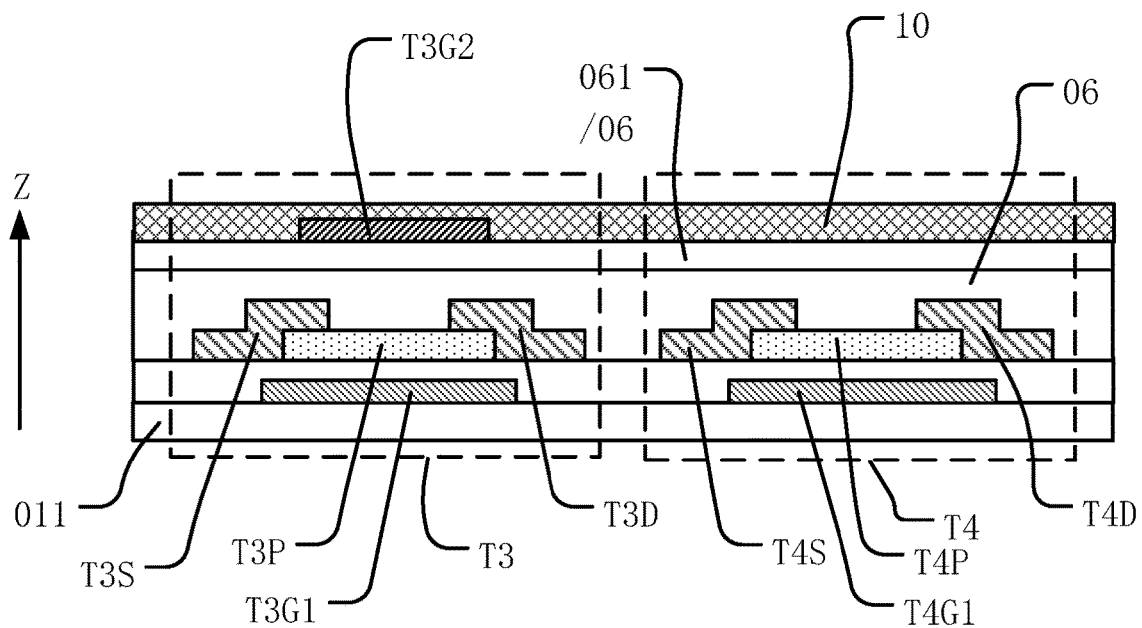
FIG. 15 illustrates another structure of the exemplary detection device in FIG. 13.

FIG. 15 is another schematic structural diagram of the detection device in FIG. 13. Because the top gate T4G2 of the fourth transistor T4 in this embodiment may be floating, the top gate T4G2 may not be used, the portion of the ion-sensitive membrane 10 above the channel of the fourth transistor T4 may be directly configured as the to-be-detected potential terminal P. That is, the ion-sensitive membrane 10 above the channel of the fourth transistor T4 may be exposed, and the ions in the solution may be accumulated on the surface of the ion-sensitive membrane 10 above the channel of the fourth transistor T4 such that the potential of the ion-sensitive membrane 10 above the channel of the fourth transistor T4 may change to detect the concentration of the solution.

Figure 16:
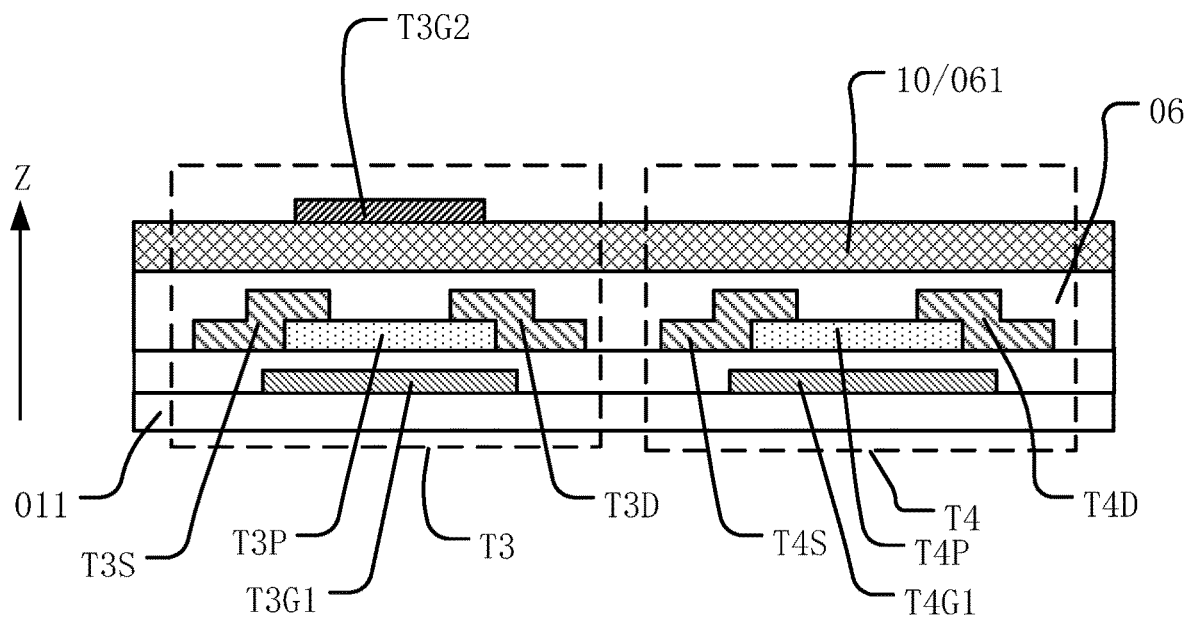
FIG. 16 illustrates another structure of the exemplary detection device in FIG. 13.

It can be understood that the first insulation layer 061 above the channel of the transistor in this embodiment may also be as shown in FIG. 16, which is another schematic structural diagram of the detection device in FIG. 13. The first insulation layer 061 between the source (or drain) of the transistor in the detection device and the top gate may be made of silicon oxide. In one embodiment, the first insulation layer 061 may be made of PA-SiO$_x$. PA-SiO$_x$ may be a thin layer structure by coating SiO$_x$ on the substrate of polyamide (PA). Because PA-SiO$_x$ may be more sensitive to hydrogen ions, when the hydrogen ion concentration in the solution such as pH value needs to be detected, the surface of PA-SiO$_x$ may adsorb hydrogen ions and may react with hydrogen ions and the amount of charges on the surface of the first insulation layer 061 above the channel of the fourth transistor T4 may change. Thus, the first insulation layer 061 made of silicon oxide material may be multiplexed as the ion-sensitive membrane 10. The first insulation layer 061 may not only play the role of insulation, but also when the first insulation layer 061 is made of silicon oxide, the first insulation layer 061 may be multiplexed as the ion-sensitive membrane 10, and the first insulation layer 061 may be disposed above the channel of the fourth transistor T4 to detect the concentration of hydrogen ions in the to-be-detected solution. Accordingly, the process steps may be simplified, and the overall thickness of the detection device may be reduced.

In some embodiments, the transistors of the detection unit 00 in this embodiment may be dual-gate transistors, and may also include the structural design shown in FIGS. 11-12. For example, the active regions of the four transistors may be made of oxide semiconductors such that detection device 000 formed by electrically connecting the dual-gate structures may also have the effect of the embodiment corresponding to FIG. 11-FIG. 12, this embodiment will not be repeated here, the related effect may be understood with reference to the embodiment corresponding to the above-mentioned FIG. 11-FIG. 12. The detection device formed by the dual-gate transistors may be only different from the detection principle and detection effect, and other effects may be understood with reference to the above-mentioned embodiments.

Figure 17:
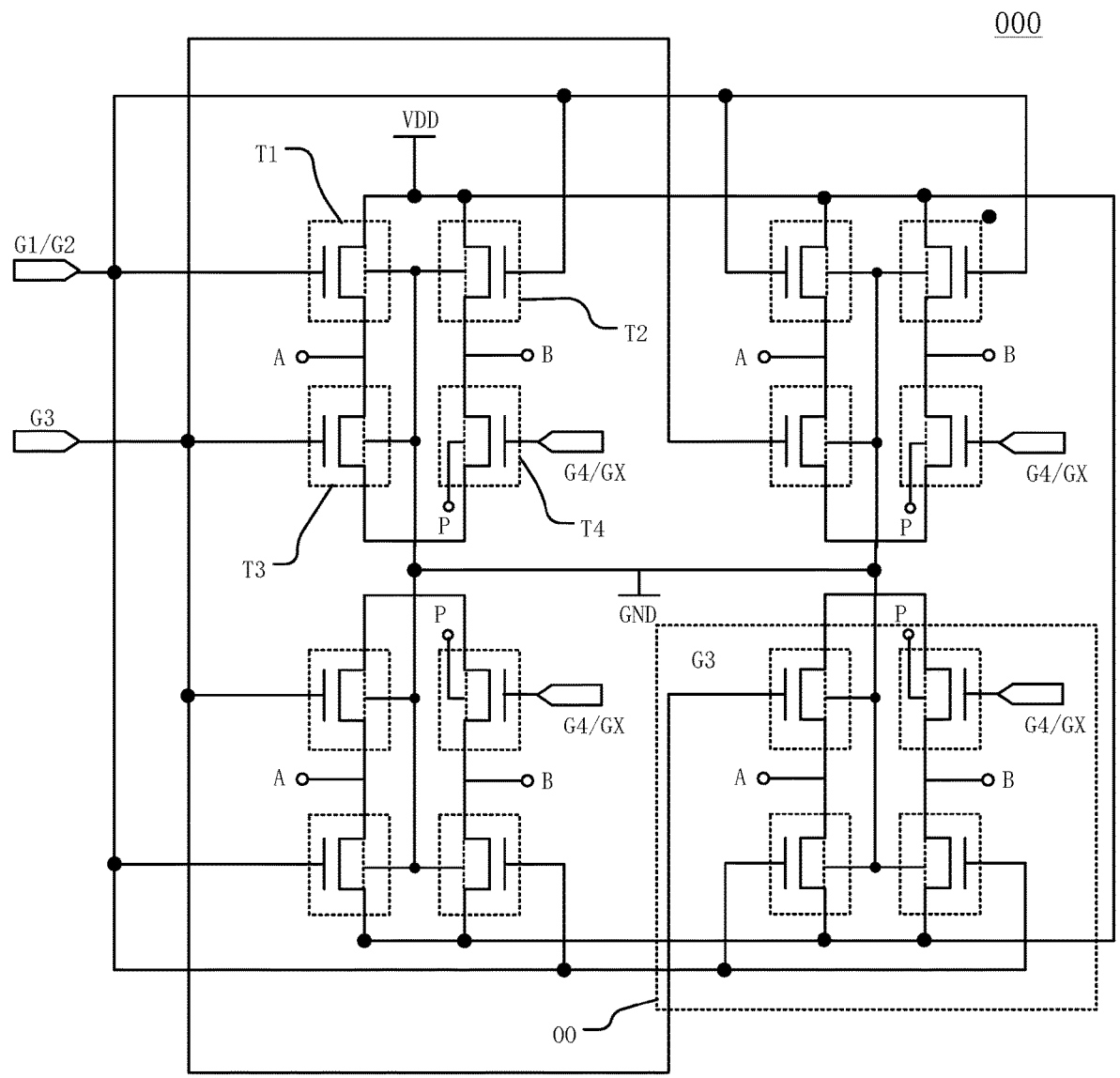
FIG. 17 illustrates a circuit connection structure of another exemplary detection device according to various disclosed embodiments of the present disclosure.

FIG. 17 is a schematic diagram of another circuit connection structure of an exemplary detection device according to various disclosed embodiments of the present disclosure. As shown in FIG. 17 and referring to FIGS. 13-15, the detection device 000 may include a plurality of detection units 00 arranged as an array.

The first voltage signal terminals G1 of the plurality of detection units 00 may be electrically connected to each other, the second voltage signal terminals G2 of the plurality of detection units 00 may be electrically connected to each other, and the third voltage signal terminals G3 of the plurality of detection units 00 may be electrically connected to each other. The first power supply terminals VDD of the plurality of detection units 00 may be electrically connected to each other, and the second power supply terminals GND of the plurality of detection units 00 may be electrically connected to each other.

This embodiment explains that the detection device 000 may include a plurality of detection units 00. The plurality of detection units 00 may be arranged as an array on the second substrate 011. For example, it can be understood that four transistors of the detection unit 00 may be arranged as a group, multiple groups of the detection units 00 of the connection structure may be arranged on the second substrate 011 as an array. In the plurality of detection units 00, the first voltage signal terminals G1 electrically connected to the same constant potential may be electrically connected to each other, the second voltage signal terminals G2 electrically connected to the same constant potential may be electrically connected to each other, and the third voltage signal terminals G3 electrically connected to the same constant potential may be electrically connected to each other.

In one embodiment, when the first voltage signal terminal G1 and the second voltage signal terminal G2 are electrically connected to a same constant potential, all the first voltage signal terminals G1 and all the second voltage signal terminals G2 in the multiple detection units 00 on the detection device 000 may also be electrically connected to one signal line. The second constant potentials electrically connected to all the third voltage signal terminals G3 of the plurality of detection units 00 may be different and all the third voltage signal terminals G3 of the plurality of detection units 00 may be electrically connected to another signal line, while the first power supply terminals VDD of the plurality of detection units 00 for providing the first power supply signal may also be electrically connected to one power supply signal line, and the second power supply terminals GND of the plurality of detection units 00 for providing the second power supply signal may also be electrically connected to another power signal line. Accordingly, the number of signal lines may be significantly reduced, thereby reducing the volume of the detection device and simplifying the manufacturing process.

When the detection device 000 includes the plurality of detection units 00, the first power supply terminal VDD and the second power supply terminal GND may be provided with different power supply signals respectively through the two common power signal lines, and at the same time, the first voltage signal terminal G1 and the second voltage signal terminal G2 of the detection device 00 may be provided with a same constant potential through the common signal line. When detecting the to-be-detected solution, the potential of the fourth voltage signal terminal G4 of each detection unit 00 may be adjusted sequentially such that after the potential of the to-be-detected potential terminal P of each detection unit 00 changes in response to the solution containing ions, the potential difference between the first potential output terminal A and the second potential output terminal B detected by each detection unit 00 may be zero; and the potential difference between the adjusted fourth voltage signal terminal G4 and the third voltage signal terminal G3 of each detection unit 00 may be obtained. Then, according to the average value of the potential difference between all the fourth voltage signal terminals G4 and the third voltage signal terminal G3 in the plurality of detection units 00, the average value of the ion concentration may be obtained. Accordingly, the overall detection accuracy of the detection device 000 may be further improved and the detection precision may be improved.

It can be understood that in FIG. 17 of this embodiment, only one detection device 000 including four detection units 00 is used as an example for the schematic illustration, and the specific implementation includes but is not limited to this number, which can be set according to actual detection requirements.

In some embodiments, referring to FIG. 13 and FIG. 14, the top gates of the first transistor T1, the second transistor T2, the third transistor T3 and the fourth transistor T4 may be disposed in a same layer and made of a same material. The bottom gates of the first transistor T1, the second transistor T2, the third transistor T3 and the fourth transistor T4 may be disposed in a same layer and made of a same material. The sources and drains of the first transistor T1, the second transistor T2, the third transistor T3 and the fourth transistor T4 may be disposed in a same layer and made of a same material. The active regions of the first transistor T1, the second transistor T2, the third transistor T3 and the fourth transistor T4 may be disposed in a same layer and made of a same material.

This embodiment explains that when each transistor included in the detection device 000 is fabricated on the second substrate 011, the top gates of the first transistor T1, the second transistor T2, the third transistor T3, and the fourth transistor T4 may be formed in the same layer by a same process and made of a same material, the bottom gates of the first transistor T1, the second transistor T2, the third transistor T3 and the fourth transistor T4 may be formed in a same layer by a same process and made of a same material. The sources and drains of the first transistor T1, the second transistor T2, the third transistor T3 and the fourth transistor T4 may be made of a same material and formed on a same layer by a same process. The active regions of the first transistor T1, the second transistor T2, the third transistor T3 and the fourth transistor T4 may be made of a same material and formed on a same layer by the same process. During the detection process, the four transistors may also be in the same environment. Accordingly, the fluctuations of the characteristics of the four transistors themselves may be kept synchronized; and only the potential of the top gate T4G2 of the fourth transistor T4, which is the detection transistor, may be affected by the to-be-detected solution. Before the detection device of this embodiment is used for detection, it may be used directly without a reference calibration. The detection device may perform a self-calibration during the detection process, and the final detection result may be relatively reliable.

FIG. 18 is a schematic top view of the detection device in FIG. 14 (it can be understood that, to clearly illustrate the structure of this embodiment, transparency is filled in FIG. 18, and the ion-sensitive membrane 10 is not illustrated in FIG. 18). As shown in FIG. 14 and FIG. 18, the layer structure of the detection device 000 may include at least a second substrate 011 and the third conductive layer 012 disposed on a side of the second substrate 011. The third conductive layer 012 may be provided with (or may include) the bottom gates of the first transistor T1, the second transistor T2, the third transistor T3 and the fourth transistor T4.

The detection device 00 may also include a second active layer 013 disposed on the side of the third conductive layer 012 facing away from the second substrate 011. The second active layer 013 may be provided with (may include) the active regions of the first transistor T1, the second transistor T2, the third transistor T3 and the fourth transistor T4.

Further, the detection device 00 may include a fourth conductive layer 014 disposed on the side of the second active layer 013 away from the second substrate 011. The fourth conductive layer 014 may be provided with (or may include) the sources and drains of the first transistor T1, the second transistor T2, the third transistor T3 and the fourth transistor T4. Further, the detection device 00 may include a fifth conductive layer 015 disposed on the side of the fourth conductive layer 014 facing away from the second substrate 011. The fifth conductive layer 015 may be provided with the top gates of the first transistor T1, the second transistor T2, the third transistor T3 and the fourth transistor T4.

This embodiment explains the schematic diagram of the layer structure of each transistor of the detection device 000 fabricated on the second substrate 011, different structures of four transistors fabricated in the same layer of materials and by the same process may be realized, and the fluctuation of the characteristics of the four transistors themselves may be kept synchronized. Accordingly, the final detection result may be more reliable.

In one embodiment, each signal terminal of the detection device 000 in this embodiment may be disposed on a seventh conductive layer 016, and the seventh conductive layer 016 may be disposed on the side of the third conductive layer 012 adjacent to the second substrate 011 (not shown in FIG. 14). For example, the first voltage signal terminal G1, the second voltage signal terminal G2, the third voltage signal terminal G3, the fourth voltage signal terminal G4, the first power supply terminal VDD, the second power supply terminal GND, the first potential output terminal A and the second potential output terminal B may all be disposed on the seventh conductive layer 016 to avoid affecting the structures of the transistors of other conductive layers. Accordingly, while effectively avoiding the occurrence of a short circuit, the signal terminals of the detection device 000 and the electrically connected signal lines, detection lines, etc. may be far away from the to-be-detected solution to avoid affecting the detection sensitivity of the ion-sensitive membrane 10.

In some embodiments, as shown in FIG. 18, the first voltage signal terminal G1, the second voltage signal terminal G2, the third voltage signal terminal G3, the fourth voltage signal terminal G4, the first power supply terminal VDD, the second power supply terminal GND, the first potential output terminal A and the second potential output terminal B may all be disposed at the periphery of the entire detection device 000, e.g., the region of the second substrate 011 adjacent to the outer edge. Such a configuration may avoid the effect of the disposition of the first voltage signal terminal G1, the second voltage signal terminal G1, the third voltage signal terminal G3, the fourth voltage signal terminal G4, the first power supply terminal VDD, the second power supply terminal GND, the first potential output terminal A, and the second potential output terminal B on the contact between the transistor and the to-be-detected solution. Accordingly, the effect to the detection result may be avoided.

Further, as shown in FIG. 18, because the first voltage signal terminal G1, the second voltage signal terminal G2, the third voltage signal terminal G3, the fourth voltage signal terminal G4, the first power supply terminal VDD, the second power supply terminal GND, the first potential output terminal A, and the second potential output terminal B may be disposed on the seventh conductive layer 016, and the bottom gates, top gates, sources, and drains, etc. of the transistors electrically connected to them may be disposed on other conductive layers, vias K may be disposed between the two conductive layers to realize the electrical connections between each terminals and different conductive layers. It can be understood that the opening positions of the vias K may not be specifically limited in this embodiment, and it may only need to satisfy that the transistor itself is not affected. For example, a plurality of vias K may be arranged at the periphery of the entire detection device 000, i.e., the region of the second substrate 011 adjacent to the outer edge, to prevent the arrangement of the vias K from affecting the detection accuracy.

If the seventh conductive layer 016 includes a common first voltage signal terminal G1 and a second voltage signal terminal G2, the bottom gate T1G1 of the first transistor T1 and the bottom gate T2G1 of the second transistor T2 may be electrically connected together in the third conductive layer 012, and then extend to the periphery of the detection device 000 through a third extension portion Y3 such that in the direction perpendicular to the plane where the second substrate 011 is located, the third extension portion Y3 on the third conductive layer 012 and the common first voltage signal terminal G1 and the second voltage signal terminal G2 on the seventh conductive layer 016 may at least partially overlap. Then, the bottom gate T1G1 of the first transistor T1 and the bottom gate T2G1 of the second transistor T2 may be electrically connected to the first voltage signal terminal G1 through the via K.

If the seventh conductive layer 016 includes the first power supply terminal VDD, the source T1S of the first transistor T1 and the source T2S of the second transistor T2 may be electrically connected together in the fourth conductive layer 014, and then may be extended to the periphery of the detection device 000 through a fourth extension portion Y4 such that, in the direction perpendicular to the plane where the second substrate 011 is, the fourth extension portion Y4 located in the fourth conductive layer 014 and the first power supply terminal VDD located in the seventh conductive layer 016 may at least partially overlap, and then through the via hole K, the source T1S of the first transistor T1 and the source T2S of the second transistor T2 may be both electrically connected to the first power supply terminal VDD. The settings of the other signal terminals may be illustrated with reference to FIG. 18, and details are not described here in this embodiment.

Further, the seventh conductive layer 016 may also be configured to dispose on the signal lines electrically connected with the first voltage signal terminal G1, the third voltage signal terminal G3, the fourth voltage signal terminal G4, the first power supply terminal VDD, the second power supply terminal GND, the first potential output terminal A and the second potential output terminal B are respectively electrically connected to the signal lines (not shown in the figure), respectively. Each signal line may be arranged on the periphery of the four transistors. For example, the orthographic projection of the signal line on the second substrate 011 may not overlap with the four transistors. Such a configuration may prevent the seventh conductive layer 016 from affecting the detection effect of the detection unit.

The present disclosure also provides a detection method. FIG. 19 is a flowchart of an exemplary detection method according to various disclosed embodiments of the present disclosure. The detection method may be applied to the detection device in the embodiment of FIG. 3-FIG. 12 to detect the concentration of the to-be-detected solution. As shown in FIG. 19 and referring to FIGS. 3-12, the detection method may include:

S10: placing the detection device in the to-be-detected solution, and adjusting the potential of the third voltage signal terminal G3 such that the potential difference between the first potential output terminal A and the second potential output terminal B may be 0; and S11: calculating the concentration of the to-be-detected solution according to the adjusted potential of the third voltage signal terminal G3 when the potential difference between the first potential output terminal A and the second potential output terminal B is 0.

In the detection method provided in this embodiment, during the detection process of the to-be-detected, the first voltage signal terminal G1 and the second voltage signal terminal G2 may be respectively electrically connected to a constant potential. In one embodiment, the potentials of the voltage signal terminal G1 and the second voltage signal terminal G2 may be equal. Then, the detection device may be placed in the to-be-detected solution. Because there is an ion-sensitive membrane 10 above the channel of the fourth transistor T4, when the ion-sensitive membrane 10 contacts the ions in the to-be-detected solution, for example, when the ion-sensitive membrane 10 is sensitive to hydrogen ions, and the hydrogen ions in the solution are contacted, the potential on the surface of the ion-sensitive membrane 10 may change, the potential of the surface of the ion-sensitive membrane 10 above the channel of the fourth transistor T4 may change. For example, the portion of the ion-sensitive membrane 10 above the channel of the fourth transistor T4 may be used as the to-be-detected potential terminal P, and the voltage value of the to-be-detected potential terminal P may change. Then, the potential difference between the first potential output terminal A and the second potential output terminal B may also change, and the potentials of the first potential output terminal A and the second potential output terminal B may not be equal. At this time, the potential of the third voltage signal terminal G3 used as the adjustable potential terminal GX may be adjusted to cause the potential of the first potential output terminal A to be equal to the second potential output terminal B, for example, the voltage difference between the first potential output terminal A and the second potential output terminal B may be zero. When the voltage difference between the first potential output terminal A and the second potential output terminal B is zero, the potential at the portion of the ion-sensitive membrane 10 above the channel of the fourth transistor T4 serving as the to-be-detected potential terminal P may be the potential of the adjusted third voltage signal terminal G3. Thus, according to the adjusted potential of the third voltage signal terminal G3 at this time, the voltage at the portion of the ion-sensitive membrane 10 above the channel of the fourth transistor T4 after the detection device is immersed in the to-be-detected solution may be obtained; and the ion concentration of the to-be-detected solution may be obtained by calculation. Because the structures and environments of the first transistor T1 and the second transistor T2 may be the same, the voltage values of the gate of the first transistor T1 and the gate of the second transistor T2 may be same, and the voltage values of the source of the first transistor T1 and the second transistor T2 may be same, the output currents of the first transistor T1 and the second transistor T2 may also be same. When the potential values of the first potential output terminal A and the second potential output terminal B are equal, the output currents of the third transistor T3 and the fourth transistor T4 may also be considered as consistent. Thus, the potential (i.e., Vp) at the ion-sensitive membrane 10 above the channel of the fourth transistor T4 and the voltage VGx of the voltage signal terminal G3 electrically connected to the gate of the adjusted third transistor T3 at this time may be same. Because the relationship between the potential of the to-be-detected potential terminal P and the ion concentration may be related to the to-be-detected substance, for example, if the hydrogen ion concentration (that is, the pH value), is detected, then theoretically, $\Delta Vp=58$ mV/pH$\times\Delta$pH, and then the hydrogen ion concentration $\Delta$pH of the to-be-detected solution may be calculated. If the voltage of the third voltage signal terminal G3 electrically connected to the gate of the adjusted third transistor T3 is VGx, then the detected hydrogen ion concentration of the solution, the pH value, may be VGx/(58 mV/pH). It can be understood that in this embodiment, the relationship between the potential of the to-be-detected potential terminal P and the ion concentration may be different according to the different to-be-detected substances, which does not mean that the potential relationship between all ion concentrations and the to-be-detected potential terminal P is all 58 mV/pH. During the specific implementation, it should be understood with reference to the equation relationship in the related art, which will not be repeated in this embodiment.

Figure 20:
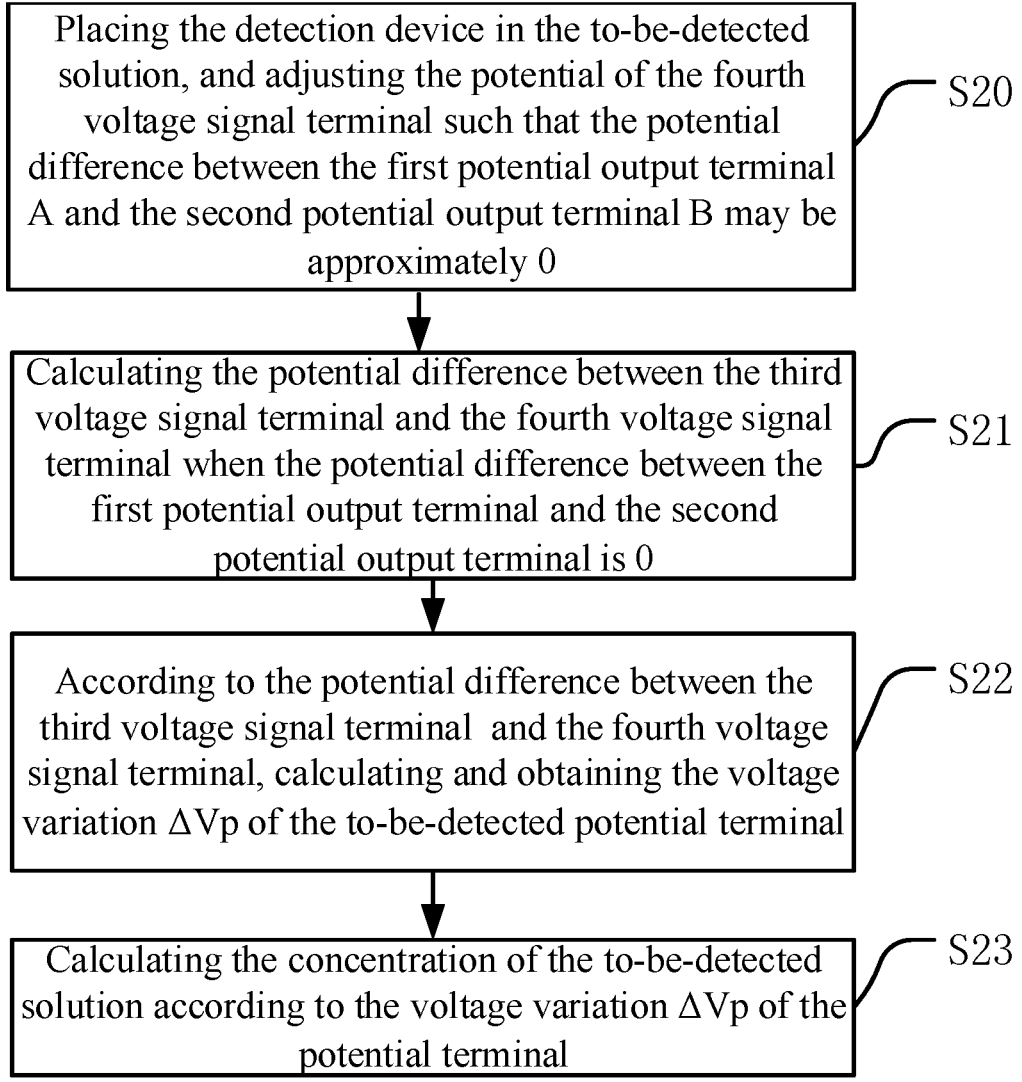
FIG. 20 illustrates a flowchart of another exemplary detection method of the present disclosed detection device according to various disclosed embodiments of the present disclosure.

FIG. 20 is a flowchart of another exemplary detection method according to various disclosed embodiments of the present disclosure. The detection method provided by this embodiment may be applied to the detection device in the embodiments of FIGS. 13-18 to detect the concentration of the to-be-detected solution. As shown in FIG. 20 and referring to FIGS. 13-18, the detection method may include:

S20: placing the detection device in the to-be-detected solution, and adjusting the potential of the fourth voltage signal terminal G4 such that the potential difference between the first potential output terminal A and the second potential output terminal B may be approximately 0;

S21: calculating the potential difference between the third voltage signal terminal G3 and the fourth voltage signal terminal G4 when the potential difference between the first potential output terminal A and the second potential output terminal B is 0;

S22: according to the potential difference between the third voltage signal terminal G3 and the fourth voltage signal terminal G4, calculating and obtaining the voltage variation $\Delta Vp$ of the to-be-detected potential terminal P; and S23: calculating the concentration of the to-be-detected solution according to the voltage variation $\Delta Vp$ of the potential terminal P.

In the detection method provided in this embodiment, during the detection process of the to-be-detected solution, the first voltage signal terminal G1 and the second voltage signal terminal G2 may be respectively electrically connected to a first constant potential, and the third voltage signal terminal G3 may be electrically connected to a second constant potential different from the first constant potential, and then the detection device 000 may be placed in the to-be-detected solution. Because the ion-sensitive membrane 10 may be disposed above the channel of the fourth transistor T4, when the ion-sensitive membrane 10 comes into contact with the ions in the to-be-detected solution, for example, when the ion sensitive film 10 is sensitive to hydrogen ions, the potential of the surface of the ion-sensitive membrane 10 may change when it comes into contact with the hydrogen ions in the solution, and the potential of the top gate T4G2 of the fourth transistor T4 may change, that is, the potential of the to-be-detected potential terminal P may change. At this time, the potential of the fourth voltage signal terminal G4 which is the adjustable potential terminal GX may be adjusted such that the potential values of the first potential output terminal A and the second potential output terminal GX may be equal. For example, the potential difference between the first potential output terminal A and the second potential output terminal B may be approximately 0. In one embodiment, an ammeter may be electrically connected between the first potential output terminal A and the second potential output terminal b during detection. By observing whether the indication of the ammeter is 0, the potential difference between the first potential output terminal A and the second potential output terminal B may be determined to be 0 or not. When the voltage difference between the first potential terminal A and the second potential output terminals B is zero, the potential difference between the third voltage signal terminal G3 and the fourth voltage signal terminal G4 may be calculated. According to the potential difference between the third voltage signal terminal G3 and the fourth voltage signal terminal G4, the voltage variation $\Delta Vp$ of the to-be-detected potential terminal P may be obtained by calculation, and then the concentration of the to-be-detected solution may be obtained by calculation according to the voltage variation $\Delta Vp$ of the to-be-detected potential terminal P.

In one embodiment, S22 of the detection method: according to the potential difference between the third voltage signal terminal G3 and the fourth voltage signal terminal G4, calculating and obtaining the voltage variation $\Delta Vp$ of the to-be-detected potential terminal P may include following conditions.

When the potential difference between the first potential output terminal A and the second potential output terminal B is 0, the potential electrically connected to the third voltage signal terminal G3 is VG3, and the measured potential of the fourth voltage signal terminal G4 is VG4.

At this time, the potential difference between the third voltage signal terminal G3 and the fourth voltage signal terminal G4 may be equal to the variation of the threshold voltage of the fourth transistor T4, and the variation of the threshold voltage of the fourth transistor T4 may be $\Delta Vth=VG4-VG3$.

The voltage variation of the to-be-detected potential terminal P may be $\Delta VP=\Delta Vth \times Cbg/Cis$. Cis is the capacitance of the insulation layer of the top gate of the fourth transistor T4, Cbg is the capacitance of the insulation layer of the bottom gate the fourth transistor T4, and Cbg/Cis is a constant.

This embodiment explains that during the detection process of the detection device, when the potential difference between the first potential output terminal A and the second potential output terminal B is 0, the output currents of the third transistor T3 and the fourth transistor T4 may be considered as consistent. Therefore, the shift amount of the threshold voltage of the fourth transistor T4 may be consistent with the potential difference between the third voltage signal terminal G3 and the fourth voltage signal terminal G4 at this time.

For a transistor, when Vgs>Vth and Vgs-Vth<Vds, the transistor is in a saturated state, and when the transistor is in a saturated state, the output current of the transistor $Ids=\frac{1}{2} \mu Cox \times W/L (Vgs-Vth)^2$. $\mu$ is the mobility of the active region of the transistor, Cox is the capacitance of the insulation layer of the gate of the transistor, and W/L is the channel width-to-length ratio of the transistor. $\mu$, Cox, and W/L may be related to the design and related to the process structure. Vth is the threshold voltage of the transistor, Vgs is the voltage difference between the gate and the source of the transistor, and Vds is the voltage difference between the source and the drain of the transistor. In this embodiment, the detection device 000 may be placed into the to-be-detected solution to detect the ion concentration. By adjusting the potential of the fourth voltage signal terminal G4 used as the adjustable potential terminal GX, the potential difference between the first potential output terminal A and the second potential output terminal B may be adjusted as 0. At this time, because the structures and environments of the first transistor T1 and the second transistor T2 in this embodiment may be same, the voltage values of the bottom gate of the first transistor T1 and the bottom gate of the second transistor T2 may be same; the voltage values of the top gate of the first transistor T1 and the top gate of the second transistor T2 may be same; and the voltage values of the source of the first transistor T1 and the source of the second transistor T2 may be same. Accordingly, the output current of the first transistor T1 may also be consistent with the output current of the second transistor T2, and the voltage values detected by the first potential output terminal A and the second potential output terminal B may be same, and the corresponding output current between the first potential output terminal A and the second potential output terminal B may also be 0. Therefore, the currents of the third transistor T3 and the fourth transistor T4 may also be considered as same. The currents of the two transistors may be same, the structures may be the same, and the environment may be same, according to $Ids=\frac{1}{2}\mu\ Cox \times W/L\ (Vgs-Vth)^2$, the Vgs−Vth of the third transistor T3 and the fourth transistor T4 may also be same. The voltage difference Vgs between the gate and the source of the third transistor T3 may be equal to the voltage difference between the potential VG3 of the third voltage signal terminal G3 and the first potential output terminal A, the voltage difference Vgs between the gate and the source of the fourth transistor T4 may be equal to the potential difference between the potential VG4 of the adjusted fourth voltage signal terminal G4 and the second potential output terminal B at this time, and the potential of the first potential output terminal A may be equal to the potential of the second potential output terminal B. Therefore, by calculating the difference between the potential VG3 of the third voltage signal terminal G3 and the potential VG4 of the adjusted fourth voltage signal terminal G4, the difference between the threshold voltages Vth may be obtained, and the threshold voltage shift ΔVth of the fourth transistor T4 may be obtained. According to the threshold voltage shift ΔVth, the voltage variation ΔVp of the to-be-detected potential terminal may be obtained. Because ΔVth=ΔVp×Cis/Cbg, then ΔVp=ΔVth×Cbg/Cis. Cis is the capacitance of the insulation layer of the top gate of the fourth transistor T4, Cbg is the capacitance of the insulation layer of the bottom gate of the fourth transistor T4. When the transistor structure is fixed, Cbg/Cis may be a constant. The relationship between the potential of the to-be-detected potential terminal P and the ion concentration may be related to the to-be-detected substance. If the concentration of the to-be-detected solution is expressed by pH value, then the theoretical pH value change of the to-be-detected solution may be Δ pH=(Δ Vp)/(58 mV/pH), and then the hydrogen ion concentration of the to-be-detected solution may be calculated. It can be understood that in this embodiment, the relationship between the potential of the to-be-detected potential terminal P and the ion concentration may be also different according to the different to-be-detected substances, which does not mean that the potential relationship between all ion concentrations and the to-be-detected potential terminal P are 58 mV/pH. During the specific implementation, it should be understood with reference to the equation relationship in the related art, which will not be repeated in this embodiment.

It can be seen from the above embodiments that present disclosed detection device and detection method may at least achieve the following beneficial effects.

In the present disclosure, four transistors with the same structure may be electrically connected to each other to form a structure that can detect the ion concentration in the solution, and only one of the transistors may need to be used as the detection transistor. Under the same environment during the process, the fluctuations of the characteristics of the four transistors themselves may be kept synchronized, and the potential at the ion-sensitive membrane above the channel of the fourth transistor, which is only used as the detection transistor, may be affected by the to-be-detected solution, and the effect to the potential may be irrelevant to other factors of the transistors and only related to the ion concentration in the solution. Further, the first potential output terminal and the second potential output terminal may have no external output current, and the potential of the first potential output terminal and the potential of the second potential output terminal may not be affected by the to-be-detected solution. Thus, the reliability of the potential of the first potential output terminal and the second potential output terminal may be relatively high. In the present disclosure, the relationship between the potential of the to-be-detected potential terminal and the ion concentration of the to-be-detected solution may be only related to the type of to-be-detected ions. During the detection process, the potential of the adjustable potential terminal may be adjusted to make the potential difference between the first potential output terminal and the second potential output terminal to be zero. Accordingly, the self-calibration of the detection device may be realized, and the error of the final detection result may be relatively small, which may facilitate to improve the detection accuracy and the stability of the detection device.

Although some specific embodiments of the present disclosure have been described in detail by way of examples, those skilled in the art should understand that the above examples are provided for illustration only and not for the purpose of limiting the scope of the present disclosure. Those skilled in the art will appreciate that modifications may be made to the above embodiments without departing from the scope and spirit of the present disclosure. The scope of the present disclosure may be defined by the appended claims.

What is claimed is:

1. A detection device, comprising:
at least one detection unit, wherein the at least one detection unit includes a first transistor, a second transistor, a third transistor and a fourth transistor that are electrically connected to each other, a gate is disposed above a channel in each of the first transistor, the second transistor, and the third transistor, and an ion-sensitive membrane covers above a channel of the fourth transistor; and
a first voltage signal terminal, a second voltage signal terminal, and a third voltage signal terminal, wherein the first voltage signal terminal is electrically connected to the gate of the first transistor, the second voltage signal terminal is electrically connected to the gate of the second transistor, and the third voltage signal terminal is electrically connected to the gate of the third transistor,
wherein a source of the first transistor and a source of the second transistor are electrically connected to a first power supply terminal, a drain of the first transistor and a source of the third transistor are electrically connected to a first potential output terminal, a drain of the second transistor and a source of the fourth transistor are electrically connected to a second potential output terminal, and a drain of the third transistor and a drain of the fourth transistor are electrically connected to a second power supply terminal.

2. The detection device according to claim 1, wherein:
a voltage of the first power supply terminal is greater than a voltage of the second power supply terminal; and
the second power supply terminal is electrically connected to ground.

3. The detection device according to claim 1, wherein:
a gate is above the channel of the fourth transistor; and
the gate is floated.

4. The detection device according to claim 3, wherein:
the first transistor, the second transistor, the third transistor and the fourth transistor are all top-gated transistors.

5. The detection device according to claim 4, wherein:
the first voltage signal terminal and the second voltage signal terminal are electrically connected to a same constant potential;
the third voltage signal terminal is an adjustable potential terminal; and
the gate of the fourth transistor is a to-be-detected potential terminal.

6. The detection device according to claim 5, wherein:
the detective device includes a plurality of detection units arranged as an array;
first voltage signal terminals of the plurality of detection units are electrically connected to each other;
second voltage signal terminals of the plurality of detection units are electrically connected to each other;
first power supply terminals of the plurality of detection units are electrically connected to each other; and
second power supply terminals of the plurality of detection units are electrically connected to each other.

7. The detection device according to claim 3, wherein:
the gates of the first transistor, the second transistor, the third transistor and the fourth transistor are disposed in a same layer and made of a same material;
the sources and the drains of the first transistor, the second transistor, the third transistor and the fourth transistor are disposed in a same layer and made of a same material; and
active regions of the first transistor, the second transistor, the third transistor and the fourth transistor are disposed in a same layer and made of a same material.

8. The detection device according to claim 7, comprising:
a first substrate;
a first active layer, disposed on a side of the first substrate, wherein the first active layer includes the active regions of the first transistor, the second transistor, the third transistor and the fourth transistor;
a first conductive layer, disposed on a side of the first active layer facing away from the first substrate, wherein the first conductive layer includes the sources and drains of the first transistor, the second transistor, the third transistor and the fourth transistor; and
a second conductive layer, disposed on a side of the first conductive layer facing away from the first substrate, wherein the second conductive layer includes the gates of the first transistor, the second transistor, the third transistor and the fourth transistor.

9. The detection device according to claim 8, wherein:
a first insulation layer is disposed between the first conductive layer and the second conductive layer;
a material for forming the first insulation layer includes silicon oxide.

10. The detection device according to claim 8, wherein:
the ion-sensitive membrane is disposed on a side of the second conductive layer facing away from the first substrate.

11. The detection device according to claim 10, wherein:
the ion-sensitive membrane overlaps the channel of the fourth transistor.

12. The detection device according to claim 10, wherein:
the ion-sensitive membrane includes a whole surface structure; and
the ion-sensitive membrane covers all the first transistor, the second transistor, the third transistor and the fourth transistor in the detection device.

13. The detective device according to claim 8, wherein:
the active region of the first transistor, the active region of the second transistor, the active region of the third transistor and the active region of the fourth transistor are made of an oxide semiconductor.

14. The detection device according to claim 13, further comprising:
an etching stop layer,
wherein:
the etching stop layer is disposed on a side of the active layer facing away from the first substrate;
the etching stop layer includes an etching stop portion; and
the etching stop portion at least overlaps the active region of the second transistor, the active region of the third transistor, and the active region of the fourth transistor, respectively.

15. The detection device according to claim 1, wherein:
the first transistor, the second transistor, the third transistor and the fourth transistor are all dual-gate transistors;
a bottom gate of the first transistor is electrically connected to the first voltage signal terminal;
a bottom gate of the second transistor is electrically connected to the second voltage signal terminal;
a bottom gate of the third transistor is electrically connected to the third voltage the signal terminal;
a bottom gate of the fourth transistor is electrically connected to a fourth voltage signal terminal; and
a top gate of the first transistor, a top gate of the second transistor and a top gate of the third transistor are all electrically connected to the second power supply terminal.

16. The detection device according to claim 15, wherein:
the first voltage signal terminal and the second voltage signal terminal are electrically connected to a same first constant potential;
the third voltage signal terminal is electrically connected to a second constant potential;
the fourth voltage signal terminal is an adjustable potential terminal; and
the top gate of the fourth transistor is a to-be-detected potential terminal.

17. The detection device according to claim 16, wherein:
the detection device includes a plurality of detection units arranged as an array;
first voltage signal terminals of the plurality of detection units are electrically connected to each other;
second voltage signal terminals of the plurality of detection units are electrically connected to each other;
third voltage signal terminals of the plurality of detection units are electrically connected to each other;
first power supply terminals of the plurality of detection units are electrically connected to each other; and second power supply terminals of the plurality of detection units are electrically connected to each other.

18. The detection device according to claim 16, wherein:
the top gate of the first transistor, the top gate of the second transistor, the top gate of the third transistor and the top gate of the fourth transistor are disposed in a same layer and made of a same material;
the bottom gate of the first transistor, the bottom gate of the second transistor, the bottom gate of the third transistor and the bottom gate of the fourth transistor are disposed in a same layer and made of a same material;
the source and the drain of the first transistor, the source and the drain of the second transistor, the source and the drain of the third transistor, and the source and the drain of the fourth transistor are disposed in a same layer and made of a same material; and
an active region of the first transistor, an active region of the second transistor, an active region of the third transistor, and an active region of the fourth transistor are disposed in a same layer and made of a same material.

19. The detection device according to claim 16, comprising:
a second substrate;
a third conductive layer, disposed on a side of the second substrate, wherein the third conductive layer includes the bottom gate of the first transistor, the bottom gate of the second transistor, the bottom gate of the third transistor and the bottom gate of the fourth transistor;
a second active layer, disposed on a side of the third conductive layer facing away from the second substrate, wherein the second active layer includes the active region of the first transistor, the active region of the second transistor, the active region of the third transistor, and the active region of the fourth transistor;
a fourth conductive layer, disposed on a side of the second active layer facing away from the second substrate, wherein the fourth conductive layer includes the source and the drain of the first transistor, the source and the drain of the second transistor, the source and the drain of the third transistor, and the source and the drain of the fourth transistor; and
a fifth conductive layer, disposed on a side of the fourth conductive layer facing away from the second substrate, wherein the fifth conductive layer includes the top gate of the first transistor, the top gate of the second transistor, the top gate of the third transistor, and the top gate of the fourth transistor.

20. A detection method, comprising:
providing a detection device, wherein the detection device includes:
at least one detection unit, wherein the at least one detection unit includes a first transistor, a second transistor, a third transistor and a fourth transistor that are electrically connected to each other, a gate is disposed above a channel of each of the first transistor, the second transistor, and the third transistor, and an ion-sensitive membrane covers above a channel of the fourth transistor; and
a first voltage signal terminal, a second voltage signal terminal, and a third voltage signal terminal, wherein the first voltage signal terminal is electrically connected to the gate of the first transistor, the second voltage signal terminal is electrically connected to the gate of the second transistor, and the third voltage signal terminal is electrically connected to the gate of the third transistor,
wherein a source of the first transistor and a source of the second transistor are electrically connected to a first power supply terminal, a drain of the first transistor and a source of the third transistor are electrically connected to a first potential output terminal, a drain of the second transistor and a source of the fourth transistor are electrically connected to a second potential output terminal, and a drain of the third transistor and a drain of the fourth transistor are electrically connected to a second power supply terminal;
placing the detection device in a to-be-detected solution;
adjusting a potential of the third voltage signal terminal to cause a potential difference between the first potential output terminal and the second potential output terminal to be zero; and
when the potential difference between the first potential output terminal and the second potential output terminal is zero, obtaining a concentration of the to-be-detected solution by a calculation according to an adjusted potential of the third voltage signal terminal.

* * * * *